United States Patent
Francis et al.

(10) Patent No.: US 11,067,345 B2
(45) Date of Patent: Jul. 20, 2021

(54) PASSIVELY DEPLOYABLE THERMAL MANAGEMENT DEVICES, SYSTEMS, AND METHODS

(71) Applicant: ROCCOR, LLC, Longmont, CO (US)

(72) Inventors: William Francis, Lyons, CO (US); Michael Hulse, Erie, CO (US); Steven Isaacs, Fort Collins, CO (US); Mark Lake, Erie, CO (US); Greg Shoukas, Denver, CO (US); Dana Turse, Broomfield, CO (US); Mario Saldana, Thornton, CO (US)

(73) Assignee: Roccor, LLC, Longmont, CO (US)

( * ) Notice: Subject to any disclaimer, the term of this patent is extended or adjusted under 35 U.S.C. 154(b) by 48 days.

(21) Appl. No.: 15/955,948

(22) Filed: Apr. 18, 2018

(65) Prior Publication Data
US 2018/0306530 A1    Oct. 25, 2018

Related U.S. Application Data

(60) Provisional application No. 62/486,935, filed on Apr. 18, 2017, provisional application No. 62/593,047, filed on Nov. 30, 2017.

(51) Int. Cl.
*F28F 13/00* (2006.01)
*B32B 9/04* (2006.01)
(Continued)

(52) U.S. Cl.
CPC ............ *F28F 13/00* (2013.01); *B32B 9/04* (2013.01); *B64G 1/222* (2013.01); *B64G 1/503* (2013.01);
(Continued)

(58) Field of Classification Search
CPC .... F28F 13/00; H01L 23/467; H01L 23/3672; B32B 9/04; B64G 1/222; B64G 1/503
(Continued)

(56) References Cited

U.S. PATENT DOCUMENTS

| 5,806,800 A | * | 9/1998 | Caplin | ............... B64G 1/503 165/41 |
| 9,004,410 B1 | | 4/2015 | Steele | |

(Continued)

OTHER PUBLICATIONS

Ono, Shoya, et al. "Thermophysical Properties of High-Thermal-Conductivity Graphite Sheet and Application to Deployable/Stowable Radiator." Journal of Thermophysics and Heat Transfer 29.2 (2015): 403-411.

*Primary Examiner* — Joel M Attey
(74) *Attorney, Agent, or Firm* — Wilson Patent Law, LLC

(57) ABSTRACT

Passively deployable thermal management devices, systems, and methods are provided in accordance with various embodiments. For example, some embodiments include a passively deployable radiator device that may include: one or more thermally conductive layers; and/or one or more strain energy components configured to deploy passively the one or more thermally conductive layers. The one or more thermally conductive layers may include one or more carbon layers. The one or more carbon layers may include at least one or more graphite layers or one or more graphene layers. At least the one or more graphite layers or the one or more graphene layers include at least one or more pyrolytic graphite sheets or one or more pyrolytic graphene sheets.

24 Claims, 23 Drawing Sheets

(51) Int. Cl.
*B64G 1/22* (2006.01)
*B64G 1/50* (2006.01)
*B64G 1/10* (2006.01)
*B64C 1/40* (2006.01)
*F28D 21/00* (2006.01)
*F28F 21/02* (2006.01)
*H01L 23/467* (2006.01)
*H01L 23/367* (2006.01)

(52) U.S. Cl.
CPC ........... *B32B 2307/302* (2013.01); *B64C 1/40* (2013.01); *B64G 1/10* (2013.01); *F28D 2021/0021* (2013.01); *F28D 2021/0029* (2013.01); *F28F 21/02* (2013.01); *F28F 2013/008* (2013.01); *F28F 2255/06* (2013.01); *H01L 23/3672* (2013.01); *H01L 23/467* (2013.01)

(58) Field of Classification Search
USPC .................................. 165/86, 276, 277, 80.3
See application file for complete search history.

(56) References Cited

U.S. PATENT DOCUMENTS

| | | |
|---|---|---|
| 9,079,673 B1 | 7/2015 | Steele |
| 2010/0326645 A1* | 12/2010 | Fan ..................... H01L 23/3677 165/185 |
| 2012/0227916 A1* | 9/2012 | Kellberg .............. H01Q 21/061 160/229.1 |
| 2012/0297717 A1* | 11/2012 | Keller ..................... H02S 20/30 52/645 |
| 2017/0246850 A1 | 8/2017 | Arias |
| 2018/0287240 A1 | 10/2018 | Davis |

* cited by examiner

← 600

```
┌─────────────────────────────┐
│                             │
│  Flip-Out Passively Deployable │
│   Radiator Device(s) 100-o  │
│                             │
└─────────────────────────────┘
              │
              │
┌─ ─ ─ ─ ─ ─ ─┼─ ─ ─ ─ ─ ─ ─┐
│                             │
│                             │
│      Heat Source(s) 140-e   │
│                             │
│                             │
└─ ─ ─ ─ ─ ─ ─ ─ ─ ─ ─ ─ ─ ─ ┘
```

Utilize strain energy of a radiator panel device to deploy passively the radiator panel device — 910

FIG. 9

PASSIVELY DEPLOYABLE THERMAL MANAGEMENT DEVICES, SYSTEMS, AND METHODS

CROSS-REFERENCES TO RELATED APPLICATIONS

This application is a non-provisional patent application claiming priority benefit of U.S. provisional patent application Ser. No. 62/486,935, filed on Apr. 18, 2017 and entitled "DEPLOYABLE THERMAL MANAGEMENT DEVICES, SYSTEMS, AND METHODS," and U.S. provisional patent application Ser. No. 62/593,047, filed on Nov. 30, 2017 and entitled "DEPLOYABLE THERMAL MANAGEMENT DEVICES, SYSTEMS, AND METHODS," the entire disclosures of which are herein incorporated by reference for all purposes.

BACKGROUND

Thermal management for different applications (e.g., space satellites, aerial vehicles, terrestrial devices) include different challenges, such as thermal conduction and/or deployment. There may be a need for new tools and techniques to address thermal management for different applications.

SUMMARY

Passively deployable thermal management devices, systems, and methods are provided in accordance with various embodiments. For example, some embodiments include a passively deployable radiator device that may include: one or more thermally conductive layers; and/or one or more strain energy components configured to deploy passively the one or more thermally conductive layers. The one or more thermally conductive layers may include one or more carbon layers. The one or more carbon layers may include at least one or more graphite layers or one or more graphene layers. At least the one or more graphite layers or the one or more graphene layers include at least one or more pyrolytic graphite sheets or one or more pyrolytic graphene sheets.

In some embodiments, the one or more strain energy components include one or more high strain composite components coupled with the one or more thermally conductive layers. The one or more high strain composite components may be configured with one or more curved hinge regions when deployed. The one or more high strain composite components may include one or more high strain composite battens coupled with a side portion of the one or more thermally conductive layers. The one or more high strain composite components include an asymmetric composite laminate configured to change shape when a change in temperature occurs.

In some embodiments, the one or more strain energy components include one or more thermally conductive composite laminates with sufficient strain energy to deploy passively the one or more thermally conductive layers. The one or more thermally conductive composite laminates may include one or more high strain laminate layers.

In some embodiments, the one or more strain energy components include one or more tape springs configured to deploy passively the one or more thermally conductive layers. The one or more tape springs may include a beryllium-copper structure. The one or more tape springs may include a high strain composite material.

In some embodiments, the one or more thermally conductive layers include multiple thermally conductive layers bonded with each other. The multiple thermally conductive layers may be bonded with each other utilizing an adhesive. The multiple thermally conductive layers may be bonded with each other utilizing diffusion bonding; one or more metal layers, such as one or more stainless steel layers formed as foils and/or meshes, may be positioned between the multiple thermally conductive layers. In some embodiments, the one or more thermally conductive layers are encapsulated.

In some embodiments, the one or more thermally conductive layers are continuous across a hinge region defined with respect to the one or more strain energy components. The one or more thermally conductive layers may include multiple thermally conductive layers that remain separate across at least a portion of the hinge region. The multiple thermally conductive layers may include a hub region position proximal to the hinge region and distal from a bonded region of the multiple thermally conductive layers.

Some embodiments include one or more coatings applied to one or more surfaces of the one or more thermally conductive layers or the one or more strain energy components. The one or more coatings may include at least a high emissivity coating or a low absorption coating.

Some embodiments include a base spool coupled with at least the one or more thermally conductive layers or the one or more strain energy components. The base spool may be configured to couple thermally at least the one or more thermally conductive layers with one or more heat sources. The one or more thermally conductive layers may be coupled with the base spool such that the one or more thermally conductive layers deploy passively through unfurling from around a central axis of the base spool from a stowed configuration to a deployed configuration.

In some embodiments, the one or more carbon layers include one or more carbon fiber plies. The one or more strain energy components may include one or more high strain laminates coupled with the one or more carbon fiber plies.

In some embodiments, at least the one or more graphite layers or the one or more graphene layers include multiple layers that are stitched together utilizing a stitching material. The stitching material may include at least CNT yarn or copper wire.

Some embodiments include methods, systems, and/or devices as described in the specification and/or shown in the figures.

The foregoing has outlined rather broadly the features and technical advantages of embodiments according to the disclosure in order that the detailed description that follows may be better understood. Additional features and advantages will be described hereinafter. The conception and specific embodiments disclosed may be readily utilized as a basis for modifying or designing other structures for carrying out the same purposes of the present disclosure. Such equivalent constructions do not depart from the spirit and scope of the appended claims. Features which are believed to be characteristic of the concepts disclosed herein, both as to their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of different embodiments may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

FIG. 6A shows a system in accordance with various embodiments.

FIG. 9 shows a flow diagram of a method in accordance with various embodiments.

DETAILED DESCRIPTION

This description provides embodiments, and is not intended to limit the scope, applicability or configuration of the disclosure. Rather, the ensuing description will provide those skilled in the art with an enabling description for implementing embodiments of the disclosure. Various changes may be made in the function and arrangement of elements.

Thus, various embodiments may omit, substitute, or add various procedures or components as appropriate. For instance, it should be appreciated that the methods may be performed in an order different than that described, and that various stages may be added, omitted, or combined. Also, aspects and elements described with respect to certain embodiments may be combined in various other embodiments. It should also be appreciated that the following systems, devices, and methods may individually or collectively be components of a larger system, wherein other procedures may take precedence over or otherwise modify their application.

Passively deployable thermal management devices, systems, and methods are provided in accordance with various embodiments. Some embodiments, for example, include passively deployable radiator devices, systems, and methods. Some embodiments may provide one or more compact, lightweight, efficient, and/or low-cost deployable radiators, which may be applicable to different satellite systems such as CubeSat and SmallSat. Some embodiments include deployable radiator panels that may generally include one or more thermally conductive layers and one or more strain energy components. Some embodiments may utilize high-strain composite (HSC) deployable structures, such as battens, that may be configured to deploy passively one or more radiator panels that may include thermally conductive layers, such as graphite and/or graphene layers. Some embodiments include deployable radiator panels that may utilize multiple graphite and/or graphene sheets and one or more metal tape springs configured to deploy passively the one or more radiator panels. Some embodiments include the use of HSC construction using high-conductance carbon sheets within a laminate. The high-conductance carbon sheets may include graphite and/or graphene sheets. In some embodiments, the graphite and/or graphite sheets may include pyrolytic graphite sheets and/or pyrolytic graphene sheets.

Some embodiments utilize a spool architecture with a passively deployable radiator coupled with a heat source. A spool architecture may be beneficial for large bending radius laminate and/or device may consume internal volume. Some embodiments include a fold-out or flip-out architecture with passively deployable radiator coupled with a heat source. A fold-out or flip-out architecture may provide for a small bending radius (with high strain composites and or PGS layers, for example) and/or may consume little volume.

Figure 1A:
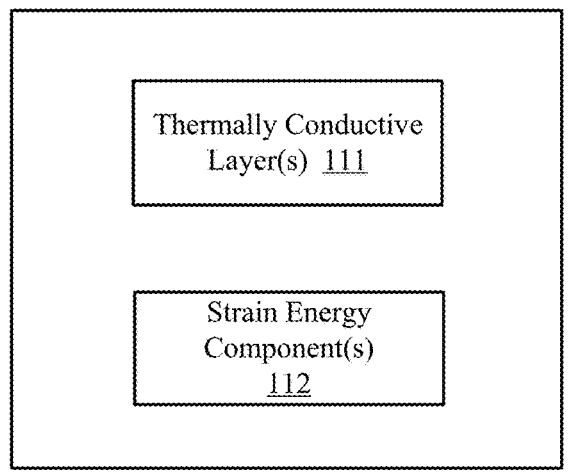
FIG. 1A shows a device in accordance with various embodiments.

Turning now to FIG. 1A, a device 100 is provided in accordance with various embodiments. Device may be referred to as a passively deployable thermal device and/or a passively deployable radiator device in some embodiments. The passively deployable radiator device 100 may include one or more thermally conductive layers 111 and/or one or more strain energy components 112 configured to deploy passively the one or more thermally conductive layers. The one or more thermally conductive layers 111 may include one or more carbon layers. The one or more carbon layers may include at least one or more graphite layers or one or more graphene layers. At least the one or more graphite layers or the one or more graphene layers include at least one or more pyrolytic graphite sheets or one or more pyrolytic graphene sheets.

In some embodiments, the one or more strain energy components 112 include one or more high strain composite components coupled with the one or more thermally conductive layers 111. The one or more high strain composite components may be configured with one or more curved hinge regions when deployed. The one or more high strain composite components may include one or more high strain composite battens coupled with a side portion of the one or more thermally conductive layers 111. The one or more high strain composite components include an asymmetric composite laminate configured to change shape when a change in temperature occurs.

In some embodiments, the one or more strain energy components 112 include one or more thermally conductive composite laminates with sufficient strain energy to deploy passively the one or more thermally conductive layers 111. The one or more thermally conductive composite laminates may include one or more high strain laminate layers.

In some embodiments, the one or more strain energy components 112 include one or more tape springs configured to deploy passively the one or more thermally conductive layers 111. The one or more tape springs may include a beryllium-copper structure. The one or more tape springs may include a high strain composite material.

In some embodiments, the one or more thermally conductive layers 111 include multiple thermally conductive layers bonded with each other. The multiple thermally conductive layers may be bonded with each other utilizing an adhesive. The multiple thermally conductive layers may be bonded with each other utilizing diffusion bonding; for example, one or more metal layers, such as one or more stainless steel layers formed as foils and/or meshes, may be positioned between the multiple thermally conductive layers to facilitate the diffusion bonding. In some embodiments, the one or more thermally conductive layers 111 are encapsulated.

In some embodiments, the one or more thermally conductive layers 111 are continuous across a hinge region defined with respect to the one or more strain energy components 112. The one or more thermally conductive layers 111 may include multiple thermally conductive layers that remain separate across at least a portion of the hinge region. The multiple thermally conductive layers may include a hub region position proximal to the hinge region and distal from a bonded region of the multiple thermally conductive layers.

Some embodiments include one or more coatings applied to one or more surfaces of the one or more thermally conductive layers 111 or the one or more strain energy components 112. The one or more coatings may include at least a high emissivity coating or a low absorption coating.

Some embodiments include a base spool coupled with at least the one or more thermally conductive layers 111 or the one or more strain energy components 112. The base spool may be configured to couple thermally at least the one or more thermally conductive layers 111 with one or more heat sources. The one or more thermally conductive layers 111 may be coupled with the base spool such that the one or more thermally conductive layers 111 deploy passively through unfurling from around a central axis of the base spool from a stowed configuration to a deployed configuration.

In some embodiments, the one or more carbon layers of the one or more thermally conductive layers 111 include one or more carbon fiber plies. The one or more strain energy components 112 may include one or more high strain laminates coupled with the one or more carbon fiber plies.

In some embodiments, at least the one or more graphite layers or the one or more graphene layers of the one or more thermally conductive layers 111 include multiple layers that are stitched together utilizing a stitching material. The stitching material may include at least CNT yarn or copper wire.

Figure 1B:
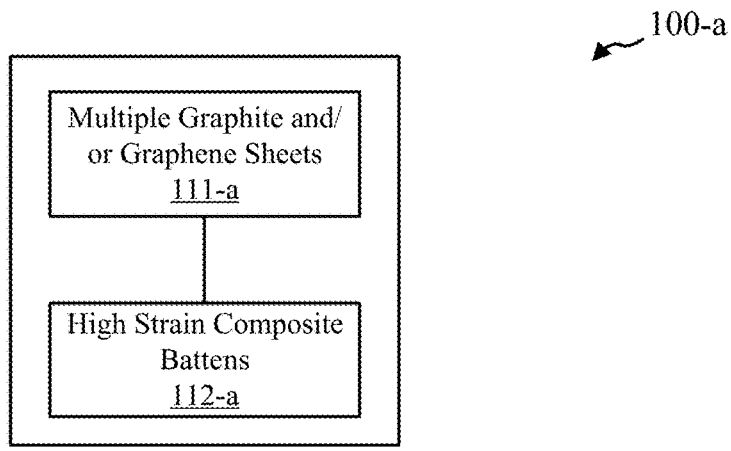
FIG. 1B shows a device in accordance with various embodiments.

For example, FIG. 1B shows a device 100-*a* in accordance with various embodiments. Device 100-*a* may be an example of device 100 of FIG. 1A; device 100-*a* may be configured as a passively deployable thermal device, such as a passively deployable radiator device. Device 100-*a* may include multiple thermally conductive layers, such as multiple graphite and/or graphene sheets 111-*a*. The multiple graphite and/or graphene layers 111-*a* may include at least one or more pyrolytic graphite sheets or one or more pyrolytic graphene sheets. Device 100-*a* may also include a strain energy component such as one or more high strain composite battens 112-*a*. The one or more high strain composite battens 112-*a* may be coupled with the multiple graphite and/or graphene sheets 111-*a*. The high strain composite battens 112-*a* may be configured with one or more curved hinge regions when deployed. In some embodiments, the high strain composite battens 112-*a* are coupled with a side portion of the multiple graphite and/or graphene sheets 111-*a*. In some embodiments, the high strain composite battens 112-*a* include an asymmetric composite laminate configured to change shape with a temperature change.

In some embodiments, the multiple graphite and/or graphene sheets 111-*a* may be adhered together with an adhesive, for example. In some embodiments, the multiple graphite and/or graphene sheets 111-*a* may be bonded together such as through the use of diffusion bonding; one or more metal layers, such as stainless-steel foils or meshes, may be placed between the multiple sheets 111-*a* to facilitate the diffusion bonding. In some embodiments, the layers 111-*a* may be left separate.

In some embodiments, the multiple graphite and/or graphene sheets 111-*a* may be encapsulated together. In some embodiments, the encapsulating layer may have a high emissivity and/or low absorption material.

Some embodiments include one or more coatings applied to one or more surfaces of one or more sheets 111-*a*. The one or more coatings may include at least a high emissivity coating or a low absorption coating.

Figure 1C:
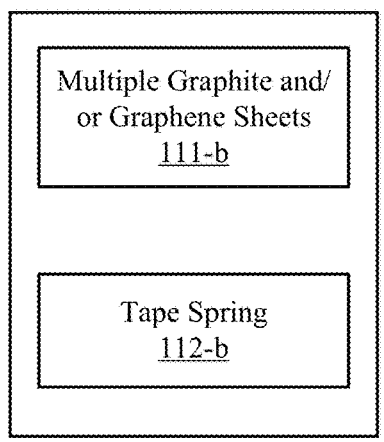
FIG. 1C shows a device in accordance with various embodiments.

FIG. 1C shows another device 100-*b* in accordance with various embodiments.

Device 100-*b* may be an example of device 100 of FIG. 1A; device 100-*b* may be configured as a passively deployable thermal device, such as a passively deployable radiator device. Device 100-*b* may include multiple thermally conductive layers, such as multiple graphite and/or graphene sheets 111-*b*. The multiple graphite and/or graphene layers 111-*b* may include at least one or more pyrolytic graphite sheets or one or more pyrolytic graphene sheets. Device 100-*b* may also include a strain energy component such a tape spring 112-*b*, which may be utilized to passively deploy the sheets 111-*b*. The tape spring 112-*b* may be fabricated from a variety of materials. For example, the tape spring 112-*b* may include a beryllium-copper structure. In some embodiments, the tape spring 112-*b* may include a high strain composite material.

In some embodiments, the multiple graphite and/or graphene sheets 111-*b* may be adhered together with an adhesive, for example. In some embodiments, the multiple graphite and/or graphene sheets 111-*b* may be bonded together such as through the use of diffusion bonding; one or more metal layers, such as stainless-steel foils or meshes, may be placed between the multiple layers 111-*b* to facilitate the diffusion bonding. In some embodiments, the sheets 111-*b* may be left separate, though in some embodiments they may be stitched together while generally remaining separate.

In some embodiments, the sheets 111-*b* are continuous across a hinge region defined with respect to the tape spring 112-*b*. The sheets 111-*b* may remain separate across at least a portion of the hinge region. The sheets 111-*b* may include a hub region position proximal to the hinge region and distal from a bonded region of the sheets 111-*b*.

Figure 1D:
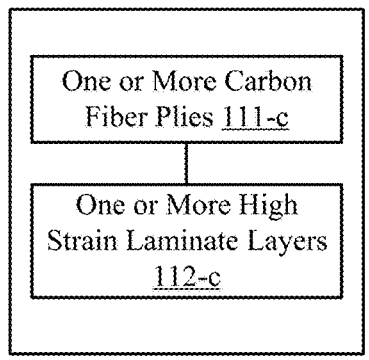
FIG. 1D shows a device in accordance with various embodiments.

FIG. 1D shows another device 100-*c* in accordance with various embodiments. Device 100-*c* may be an example of device 100 of FIG. 1A; device 100-*c* may be configured as a passively deployable thermal device, such as a passively deployable radiator device. Device 100-*c* may include one or more carbon layers as carbon fiber plies 111-*c* as of the one or more thermally conductive layers. One or more high strain laminates 112-*c* coupled with the one or more carbon fiber plies may provide for the strain energy component of device 100-*c*. The high strain laminate layers may include one or more thermally conductive composite laminates in coms embodiments. The one or more thermally conductive composite laminates may provide device 100-*c* with sufficient strain energy to deploy passively the device 100-*c* with its one or more carbon fiber plies.

In general, the use of high strain composites and/or laminate layers may be fabricated to include a laminate constructed from one or more layers of laminable material. In some embodiments, the process of creating a laminate may include impregnating or applying an adherent material with respect to one or more layers of laminable material. Sufficient heat or pressure, or both, may be applied to the one or more layers of laminable materials and the adherent material to produce the laminate. For example, in some embodiments, heat may be applied in a range of between about 10 degrees centigrade ("° C.") to about 400° C. and pressure may be applied in a range of between about 15 absolute pounds per square inch ("psi") to about 50,000 psi depending upon the composition, number, thickness, size, porosity, or other factors relating to the one or layers of laminable materials; the source of pressure (whether vacuum pressure, atmospheric pressure, mold pressure, or the like); or the source of heat (whether applied directly through a mold, or indirectly from a remote heat source). Some embodiments may utilize other temperature and/or pressure ranges. Merely by way of example, some embodiments may utilize pressures of less than 15 psi; some embodiments may use pressures below 10 psi or below 5 psi. For example, some embodiments may utilize approximately 1 psi of pressure.

In some embodiments, the one or more layers of laminable material may be used to produce the laminate layers that may be in the form of discrete or woven fibers including or consisting of, as illustrative examples: boron carbide fibers, silicon carbide fibers, alumina fibers, alumina titanium fibers, carbon fibers, para-aramid fibers such as KEVLAR®, polypropylene such as INNEGRA®, a ultra-high molecular weight polyethylene such as DYNEEMA® or SPECTRA®, s-glass, e-glass, polyester, or the like, or combinations thereof.

In some embodiments, the one or more layers of laminable material may be coated or impregnated with an amount of adherent material having suitable mechanical characteristics, including or consisting of, as illustrative examples: a phenolic, an epoxy, a polyethylene a terephtalate, a vinylester, bismaleimide/diallybisphenol A, a cyanate ester, a nylon, a polypropylene, polyethylene terephthalate, polyethersulfone, polyetheretherketone, acrylonitrile butadiene styrene, a polyamide, a polyethylene, a thermoplastic urethane, or the like, which can be either catalytically or thermally set, or combinations thereof.

Figure 1E:
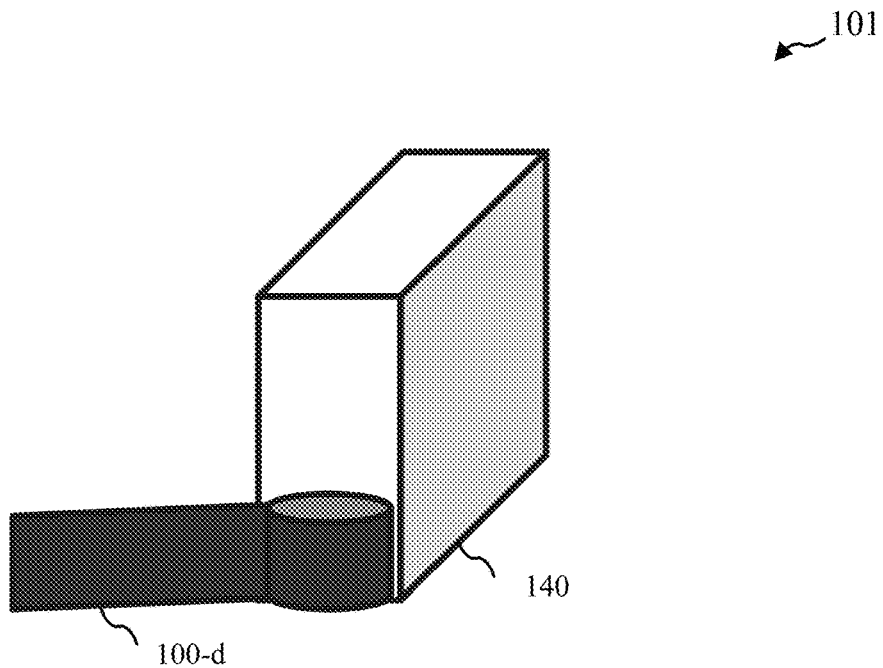
FIG. 1E shows a system in accordance with various embodiments.
Figure 1F:
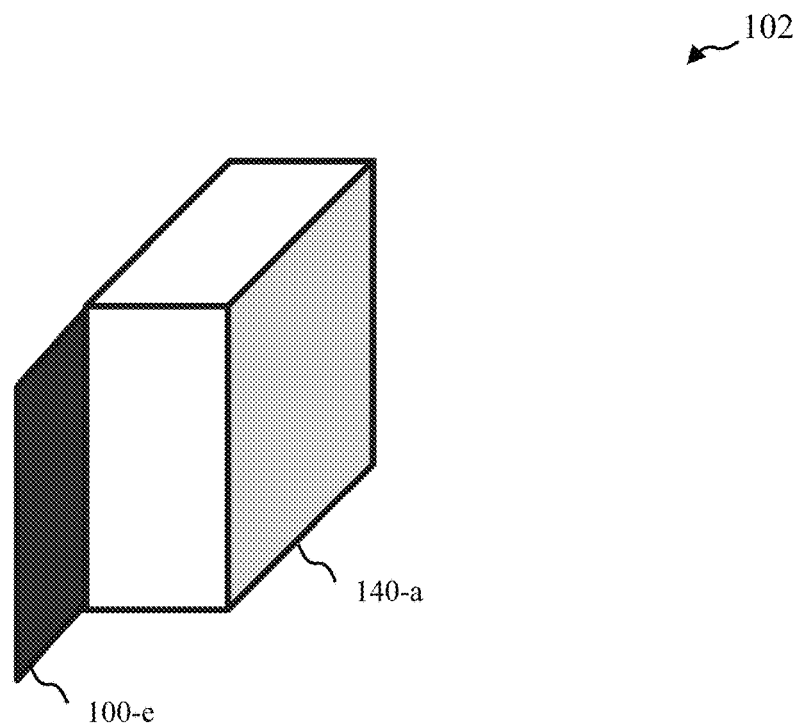
FIG. 1F shows a system in accordance with various embodiments.

Turning now to FIG. 1E and FIG. 1F, systems 101 and 102 are provided in accordance with various embodiments. System 101 may include a spool architecture with device 100-*d* as a passively deployable radiator coupled with a heat source 140, while system 102 may include a fold-out or flip-out architecture with device 100-*e* as a passively deployable radiator coupled with a heat source 140-*a*. System 101 may be beneficial for large bending radius laminate; device 100 of FIG. 1A and/or device 100-*c* of FIG. 1D may provide such structures as passively deployable radiators. System 101 may consume internal volume. System 102 may provide for a small bending radius (with high strain composites and or PGS layers, for example). System 102 may consume little volume. System 102 may provide easily for interfaces with bus and/or other components. Device 100 of FIG. 1A, device 100-*a* of FIG. 1B, and/or device 100-*b* of FIG. 1C may provide such structures as passively deployable radiators.

Figure 2A:
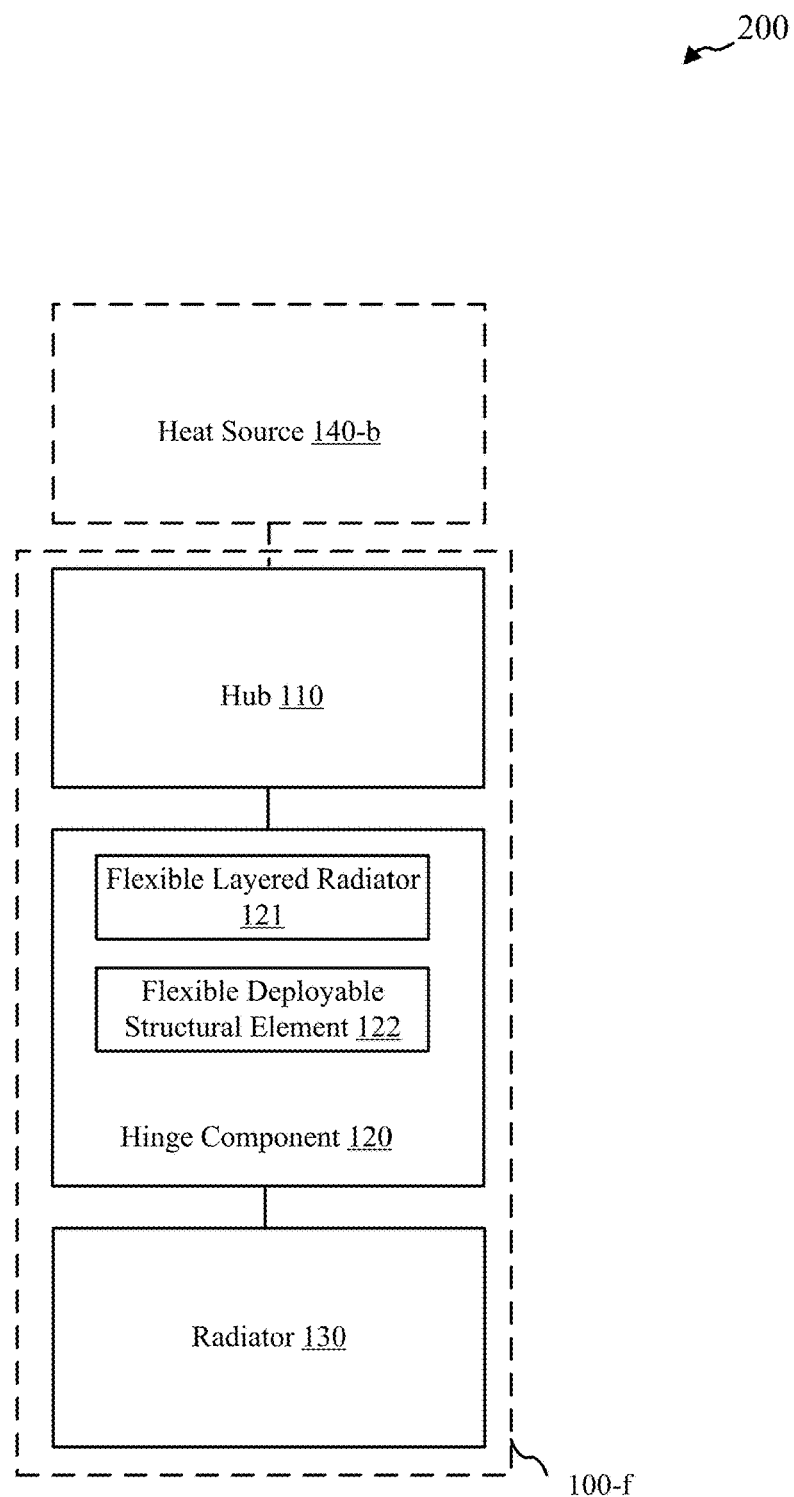
FIG. 2A shows a system in accordance with various embodiments.

Turning now to FIG. 2A, a passively deployable radiator system 200 in accordance with various embodiments is provided. System 200 may be an example of system 102 of FIG. 1F. System 200 may include a device 100-*f*, which may be an example of device 100 of FIG. 1A, device 100-*b* of FIG. 1C, and/or device 100-*e* of FIG. 1F. System 200 may be an example of system 102 of FIG. 1F. Device 100-*f* may include a hub 110 and/or a radiator 130. The hub 110 and/or the radiator 130 may be rigid in some embodiments. In some embodiments, the hub 110 may be coupled with a heat source 140-*b*. In some embodiments, the hub 110 and/or the radiator 130 may include a continuous, encapsulated, and/or stacked sheets of thermal conductive material. In some embodiments, the stacked sheets of thermal conductive material may include graphite and/or graphene sheets; the graphite sheets and/or graphene sheets may include pyrolytic graphite and/or pyrolytic graphene, for example. In some embodiments, the radiator 130 may be split into multiple sections (e.g., two, three, or four sections). One or more tape springs may be positioned between the separate sections to facilitate spreading of the sections from each other for deployment; some embodiments may utilize beryllium copper tape springs as spreaders. In some embodiments, the radiator 130 may include multiple sheets of material, such as PGS, that are loosely stacked together; in some embodiments, the loosely stacked sheets may be stitched together. A tape spring, such as a beryllium copper tape spring, may provide a structural element that supports the multiple loose sheets; the tape spring and loose sheets may be stitched together.

Device 100-f may also include a hinge component 120, which may be a flexible hinge section. The hinge component 120 may include a flexible layered radiator 121 and/or a flexible deployable structural element 122. The flexible layered radiator 121 may include a stack of individual, thin, thermal conductive sheets; the thermal conductive sheets may include high thermal conductivity materials such as graphite sheets and/or graphene sheets; these may include pyrolytic graphite sheets and/or pyrolytic graphene sheets (PGS). These sheets may be free to slide relative to one another so that the stack may remain very flexible while providing an effective thermal path from a heat source to a heat sink. These sheets may be toughened in some embodiments. The flexible deployable structural element 122 may include a flexible tape-spring hinge. For example, flexible deployable structural element 122 may include a high-strain composite (HSC); a high-strain carbon-fiber composite laminate, which may attain a curved cross section when deployed, may provide mechanical strength and/or stiffness across the hinge component 120 and may be able to deploy passively due to its ability to store strain energy. In some embodiments, the flexible deployable structure element 122 may include a beryllium copper tape spring; some embodiments may utilize other materials, such as a high-strain composite material.

In some embodiments, continuous sheets of materials, such as PGS, may be utilized to fabricate a hub 110, a flexible layered radiator 121, and a radiator 130. The portion of the layers that may form the hub 110 may be bonded with each other to form a rigid structure, while the portion of the layers that may form the flexible layered radiator 121 may be left separate. The portions of sheets that may form the radiator 130 may be bonded with each other; in some embodiments, subsets of the sheets may be bonded with each other such that the radiator 130 includes two or more split radiator sections.

Device 100-f may be configured as a radiator that may utilize convective heat loss and/or radiative heat loss, which may depend upon different applications and/or environments.

Figure 2B:
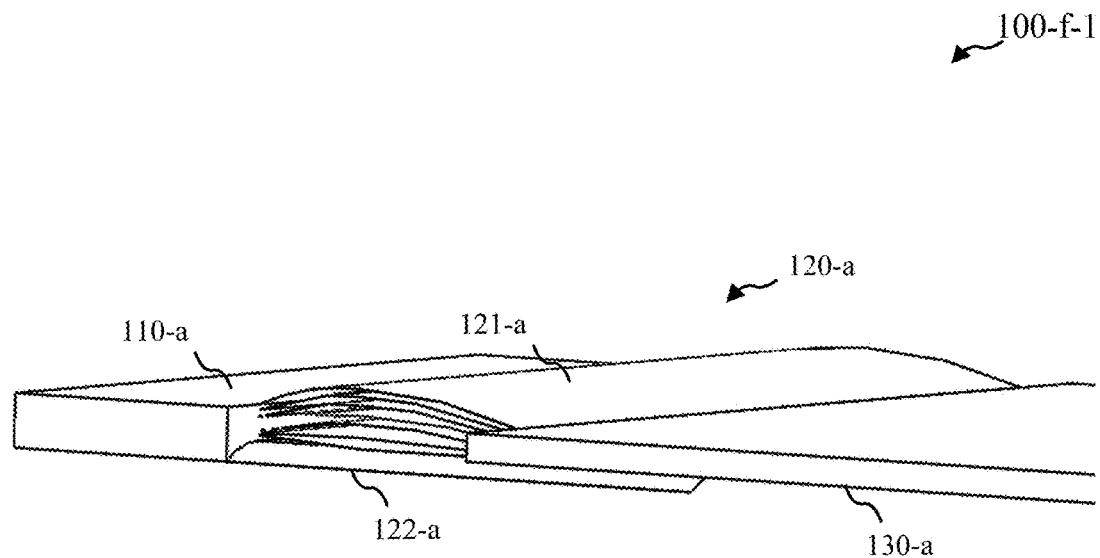
FIG. 2B shows a device in accordance with various embodiments.
Figure 2C:
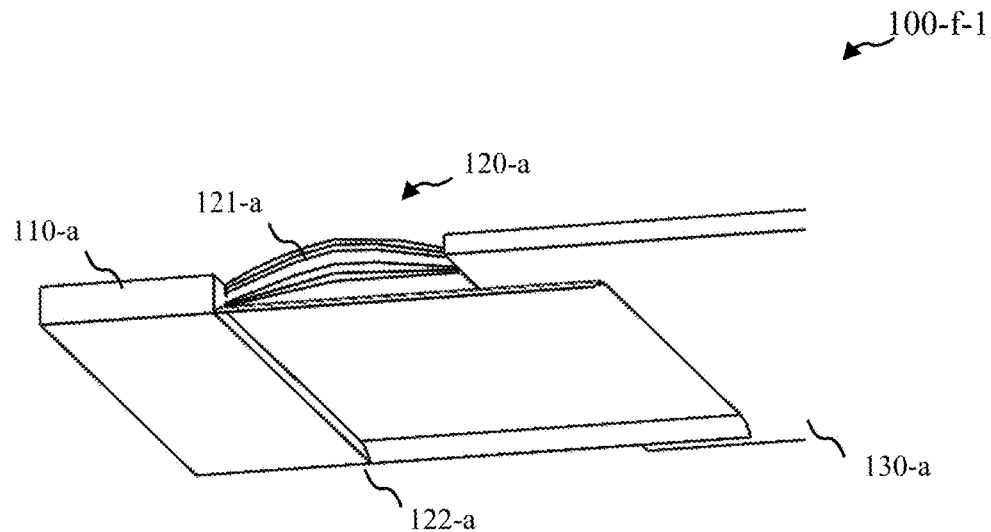
FIG. 2C shows a device in accordance with various embodiments.

Turning now to FIG. 2B and FIG. 2C, an isometric top view and an isometric bottom view of a passively deployable radiator device 100-f-1 in accordance with various embodiments are provided. This passively deployable radiator device 100-f-1 may be example of the device 100 of FIG. 1A, device 100-b of FIG. 1C, device 100-e of FIG. 1F, and/or device 100-f of FIG. 2A.

The device 100-f-1 may include a hinge component 120-a that may include a flexible radiator section 121-a. The flexible radiator section 121-a may include a stack of individual, encapsulated, thin, high thermal conductivity graphite sheets and/or graphene sheets; these may include pyrolytic graphite sheets and/or pyrolytic graphene sheets (PGS). These sheets may be free to slide relative to one another so that the stack may remain very flexible while providing an effective thermal path from a heat source to a heat sink. These sheets may be toughened in some embodiments. The hinge component 120-a may also include a flexible deployable structural element 122-a that may include a high-strain composite (HSC). A high-strain carbon-fiber composite laminate, which may attain a curved cross section when deployed, may provide mechanical strength and/or stiffness across the deployed flexible hinge 120-a and may be able to deploy passively due to its ability to store strain energy. The flexible deployable structural element 122-a as a HSC element may provide deployment torque and may attain cross-sectional curvature; this may provide structural depth when deployed.

Device 100-f-1 may also include a radiator 130-a, which may be rigid, and a hub 110-a, which may also be rigid. In some embodiments, the radiator 130-a and/or the hub 110-a may include a rigid PGS. For example, the radiator 130-a and/or the hub 110-a may include the same, continuous encapsulated and stacked PGS sheets utilized in the flexible layered radiator section; for example, stacked PGS sheets may be bonded with one another with a thermal interface adhesive that may provide a high level of mechanical rigidity and adequate through-thickness thermal conductivity.

In some embodiments, the high-strain composite carbon fiber laminate and the high thermal conductivity layers may achieve an overall effective in-plane thermal conductivity of approximately 1200 W/m-K (though other thermal conductivity values may be achieved in some embodiments), while allowing for flexible hinges from the base to the flat rigid panels, with minimum torque that may be required for the deployment of the panels. The individual PGS sheets composing the flexible section may be encapsulated for mechanical and/or environmental durability. In some embodiments, a bonding solution in the rigid regions may provide an encapsulating solution that may protect the panels from contaminants and environmental conditions.

Figure 2D:
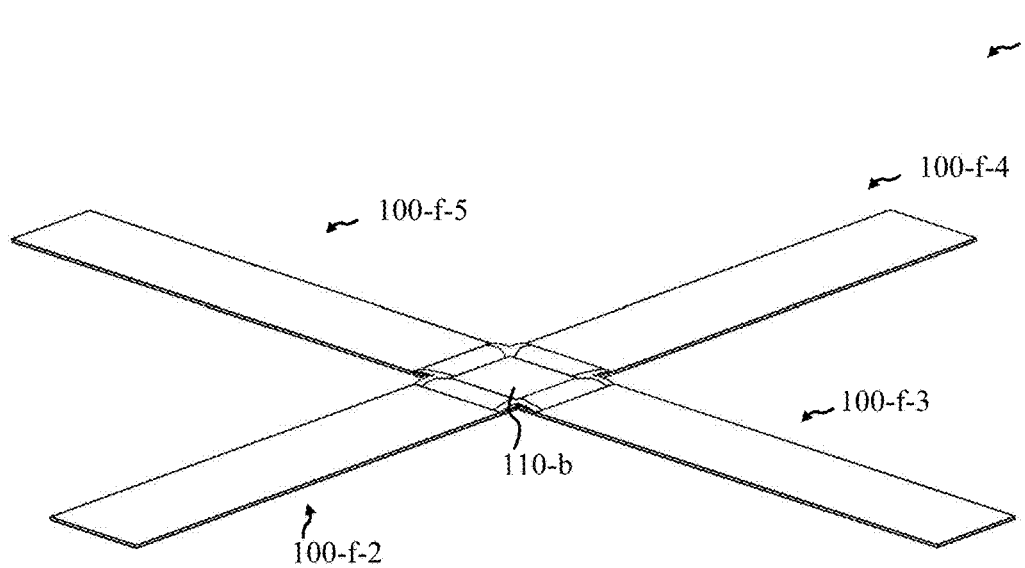
FIG. 2D shows a system and/or device in accordance with various embodiments.
Figure 2E:
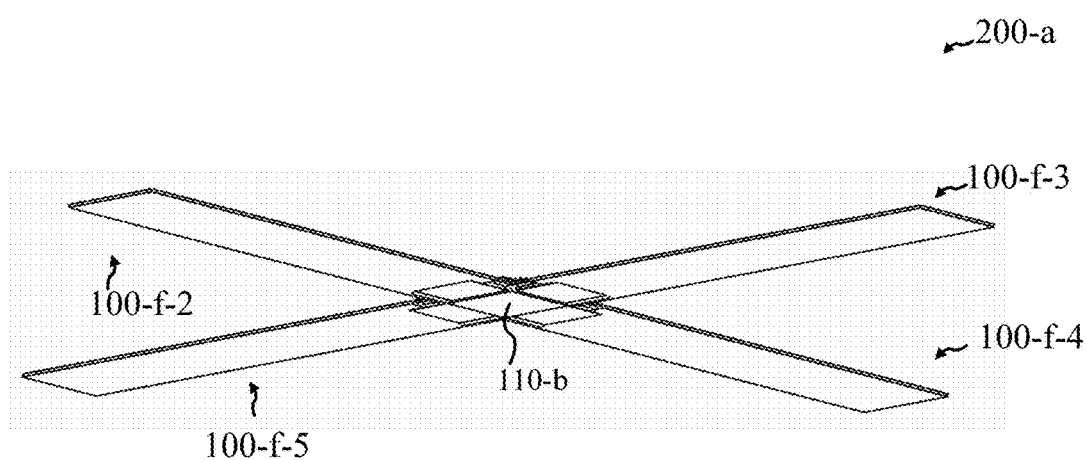
FIG. 2E shows a system and/or device in accordance with various embodiments.

Turning now to FIG. 2D and FIG. 2E, an isometric top view and an isometric bottom view of a system 200-a in accordance with various embodiments. This example may include a quad panel passively deployable radiator. System 200-a may include multiple passively deployable radiators 100-f-2, 100-f-3, 100-f-4, and 100-f-5, which may be examples of passively deployable radiator 100-f of FIG. 2A and/or 100-f-1 of FIG. 2B. In general, deployable radiators 100-f-2, 100-f-3, 100-f-4, and 100-f-5 may be examples of device 100 of FIG. 1A, device 100-b of FIG. 1C, and/or device 100-e of FIG. 1F. These four devices may share a common hub 110-b. System 200-a may be an example of system 102 of FIG. 1F and/or system 200 of FIG. 2A.

In some embodiments, system 200-a may be capable of dissipating 300-watts of thermal energy, though other amounts of heat may be dissipated. The quad panel may utilize a hybrid lamination of high-strain composite material and high thermal-conductivity pyrolytic graphite sheet layers. Some embodiments may include a high-strain composite deployable structures and thermal management products for aircraft and satellite applications, for example.

Merely by way of example, a thermal model may be utilized to evaluate the performance of the system 200-a. For example, a quad panel was simulated with a heat input of 300 watts, and with a convective boundary conditions with a sink temperature of 20° C. The panels were modeled as a stack of high-thermal conductivity layers made of pyrolytic graphite sheets (PGS) on a high-strain composite laminate. This case may be representative of a highly conductive, graphite-based panel material, with a thermal conductivity of 1,500 W/m-K. As one-eighth of the geometry may be modeled, a heat load of 37.5 watts may be applied at the base. The modeling may indicate that the base temperature may be approximately 100° C. A parameter controlling the thermal performance of the quad panel may include the thermal conductivity of the PGS layers. The modelling may indicate that with a thermal conductivity of 1,500 W/m-K, the base may achieve the temperature of 100° C., which may be a maximum allowable temperature in some embodiments. If the material experiences lower values of thermal conductivity, it may be necessary to increase the thickness of the panel in order to maintain the base temperature within allowable limits.

Figure 2F:
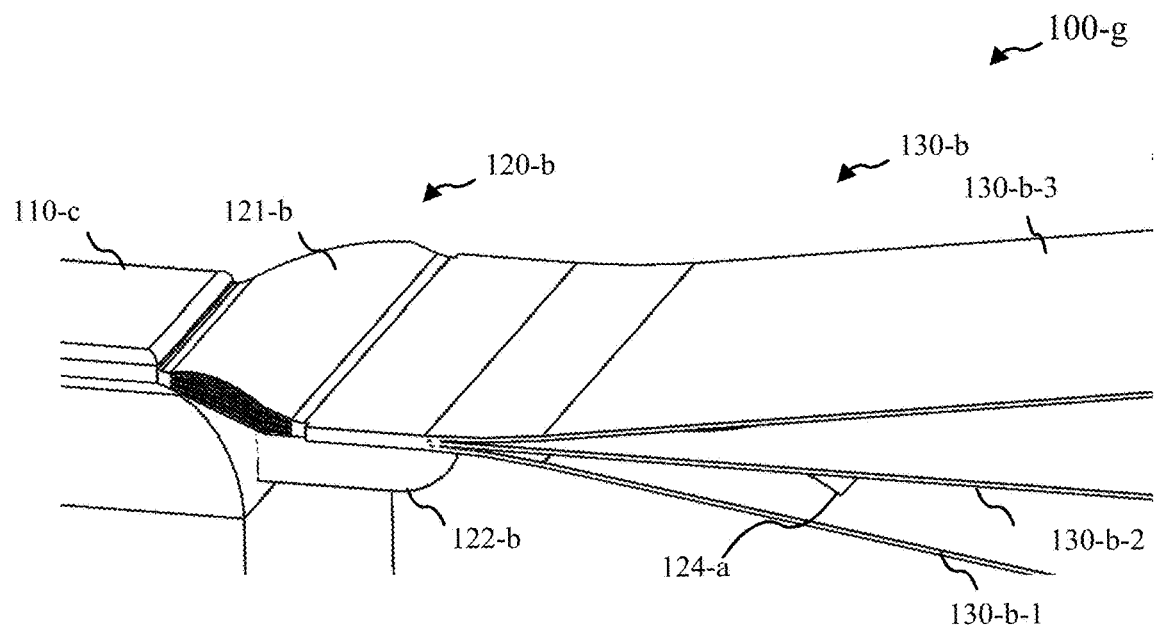
FIG. 2F shows a device in accordance with various embodiments.
Figure 2G:
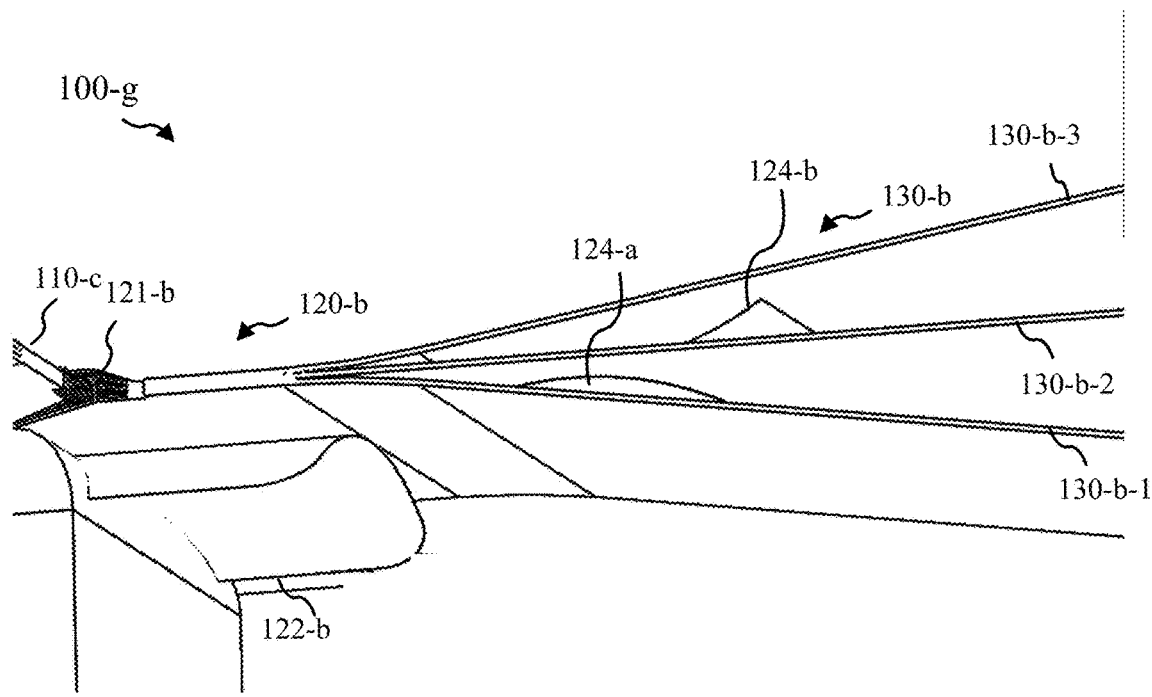
FIG. 2G shows a device in accordance with various embodiments.

Turning now to FIG. 2F and FIG. 2G, a top isometric view and a bottom isometric view of a passively deployable radiator device 100-g in accordance with various embodiments is provided. Device 100-g may be an example of device 100 of FIG. 1A, device 100-b of FIG. 1C, device 100-e of FIG. 1F, and/or device 100-f of FIG. 2A.

Device 100-g may include a hinge component 120-b, which may be referred to as a flexible radiator section. The hinge component 120-b may include a stack of individual, encapsulated, thin, high thermal conductivity pyrolytic graphite (or graphene) sheets (PGS); this may be an example of a flexible layered radiator 121-b. These sheets may be free to slide relative to one another so that the stack may remain very flexible while providing an effective thermal path from the heat source to the heat sink.

The hinge component 120-b may also include a flexible deployable structural element 122-b, which may include beryllium copper tape-spring(s), that may passively provide deployment actuation energy and subsequently may attain a curved cross section when deployed, which may provide mechanical strength and/or stiffness across the deployed flexible hinge. Some embodiments may utilize a high-strain composite (HSC) as its flexible deployable structural element 122-b.

Device 100-g may also include rigid radiator 130-b and hub sections 110-c, which may include the same, continuous encapsulated and stacked PGS sheets utilized in the flexible radiator section but may be mechanically bonded to one another, which may provide a high level of mechanical rigidity and adequate through-thickness thermal conductivity. In some embodiments, the rigid radiator 130-b may include multiple sub-radiators 130-b-1, 130-b-2, 130-b-2 (three are shown, but more or fewer may be utilized). The rigid radiator 130-b may be split into rigid radiator sections in effect. One or more tape springs 124-a/124-b, such as beryllium copper tape-spring elements, may be placed between the radiator sections, which may facilitate separation between the sections for deployment; tape springs 124-a/124-b may be constructed from other materials such as a high-strain composite or other metals. The use of multiple rigid radiator sections may help increase the overall surface area of the rigid radiator when the sections are splayed apart. For example, rigid radiator with three sections rather than one section may have a surface area that is three-times greater.

The rigid radiator 130-b (including possible sections), the hub 110-c, and the flexible layered radiator 121-b may be selectively bonded. For example, the sheets of material (e.g., PGS) that may be utilized to fabricate these portions may include the bonding of the sheets for the rigid hub and rigid radiator sections, while the sheets of the flexible layered radiator may not be bonded. In some embodiments, continuous sheets of material, such as PGS, may be utilized to fabricate the device 100-g. For example, the layers of hub may be bonded, while there may be no bonding for flexible layered radiator. The portions of the layers for the rigid layer may then be bonded together. In some embodiments, there may be gaps in the bonding between one or more groups of layers of the rigid radiator, which may facilitate formation of two or more rigid radiator sections.

In some embodiments, the combined thin tape-springs 122-b and high thermal conductivity layers of the flexible layered radiator 121-b may achieve an overall effective in-plane thermal conductivity of approximately 1150 W/m-K, while allowing for flexible hinges from the base to the flat rigid panels, with minimum energy for the deployment of the panels. The individual PGS sheets composing the flexible section may be encapsulated for mechanical and/or environmental durability in some embodiments. In addition, the bonding material in the rigid regions may provide encapsulation, which may further protect the panels from contaminants and/or environmental conditions.

Figure 2H:
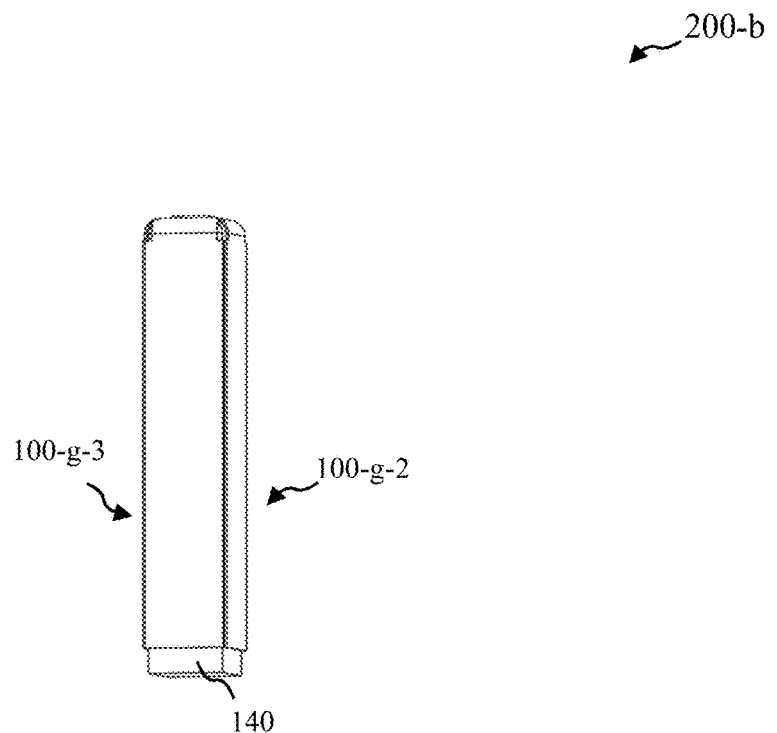
FIG. 2H shows a system in accordance with various embodiments.
Figure 2I:
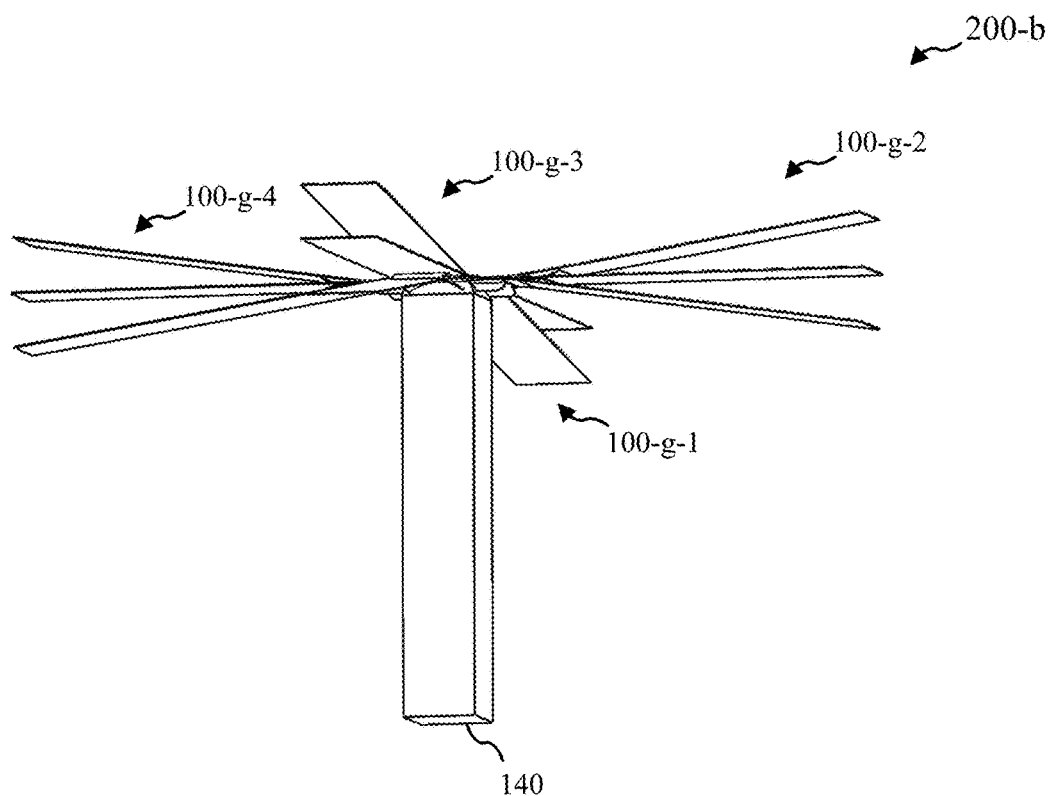
FIG. 2I shows a system in accordance with various embodiments.

FIG. 2H and FIG. 2I show a stowed isometric view and a deployed isometric view, respectively, of a system 200-b in accordance with various embodiments. System 200-b may be an example of system 102 of FIG. 1F and/or system 200 of FIG. 2A. System 200-b may include multiple passively deployable radiator devices 100-g-1, 100-g-2, 100-g-3, and 100-g-4, which may be examples of device 100 of FIG. 1A, device 100-b of FIG. 1C, device 100-r of FIG. 1G, and device 100-f of FIG. 2A, for example. In particular, the deployable radiator devices 100-g-1, 100-g-2, 100-g-3, and 100-g-4 may be examples of device 100-g of FIG. 2F and/or FIG. 2G. The deployable radiator devices 100-g-1, 100-g-2, 100-g-3, and 100-g-4 may be coupled with a heat source 140, such as a satellite bus.

In some embodiments, the deployable radiator devices 100-g-1, 100-g-2, 100-g-3, and 100-g-4 may be deployed to approximately 90 degrees for deployment (FIG. 2I may illustrate a rotation of approximately 98 degrees). System 200-b may be referred to as a quad slit-panel deployable radiator. In some embodiments, 200-b may be capable of dissipating 300-watts of thermal energy, though other heat dissipation values may also be achieved in some embodiments. The quad split-panel deployable radiator may utilize a layered structure of encapsulated high thermal-conductivity pyrolytic graphite/graphene sheets that may be combined with very thin and strategically placed tape-spring structural elements.

In some embodiments, the continuous sheets of material may be utilized to fabricate the deployable radiator devices 100-g-1, 100-g-2, 100-g-3, and 100-g-4; sheets of PGS, for example, may extend from a left edge of the rigid radiator sections (three are shown) of device 100-g-4 to a right edge of device 100-g-2. Devices 100-g-3 and 100-g-1 may be constructed in a similar fashion. In some embodiments, the sheets of material the combined devices 100-g-4/100-g-2 and devices 100-g-3/100-g-1 may alternative through the central hub section.

Figure 3A:
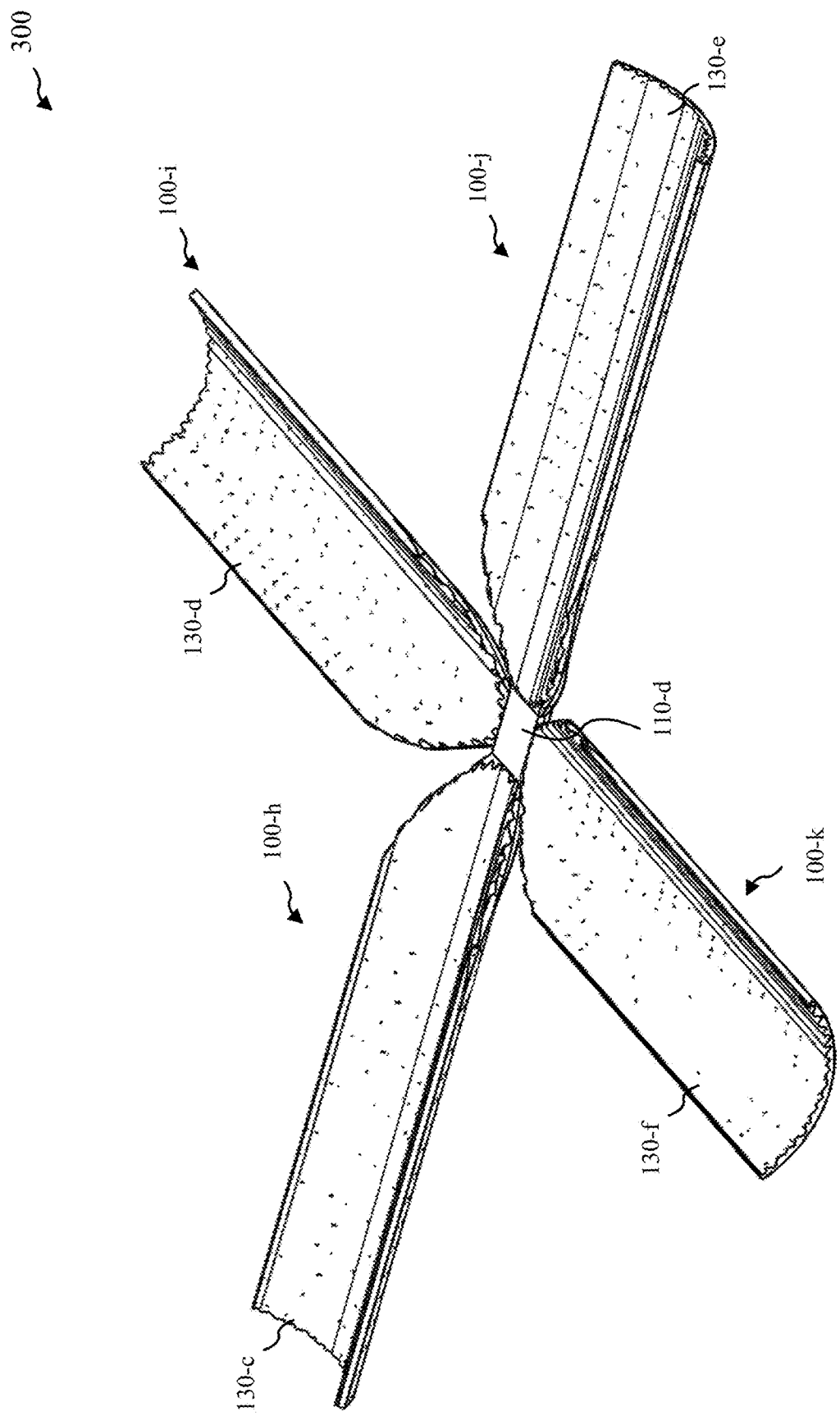
FIG. 3A shows a system and/or device in accordance with various embodiments.
Figure 3B:
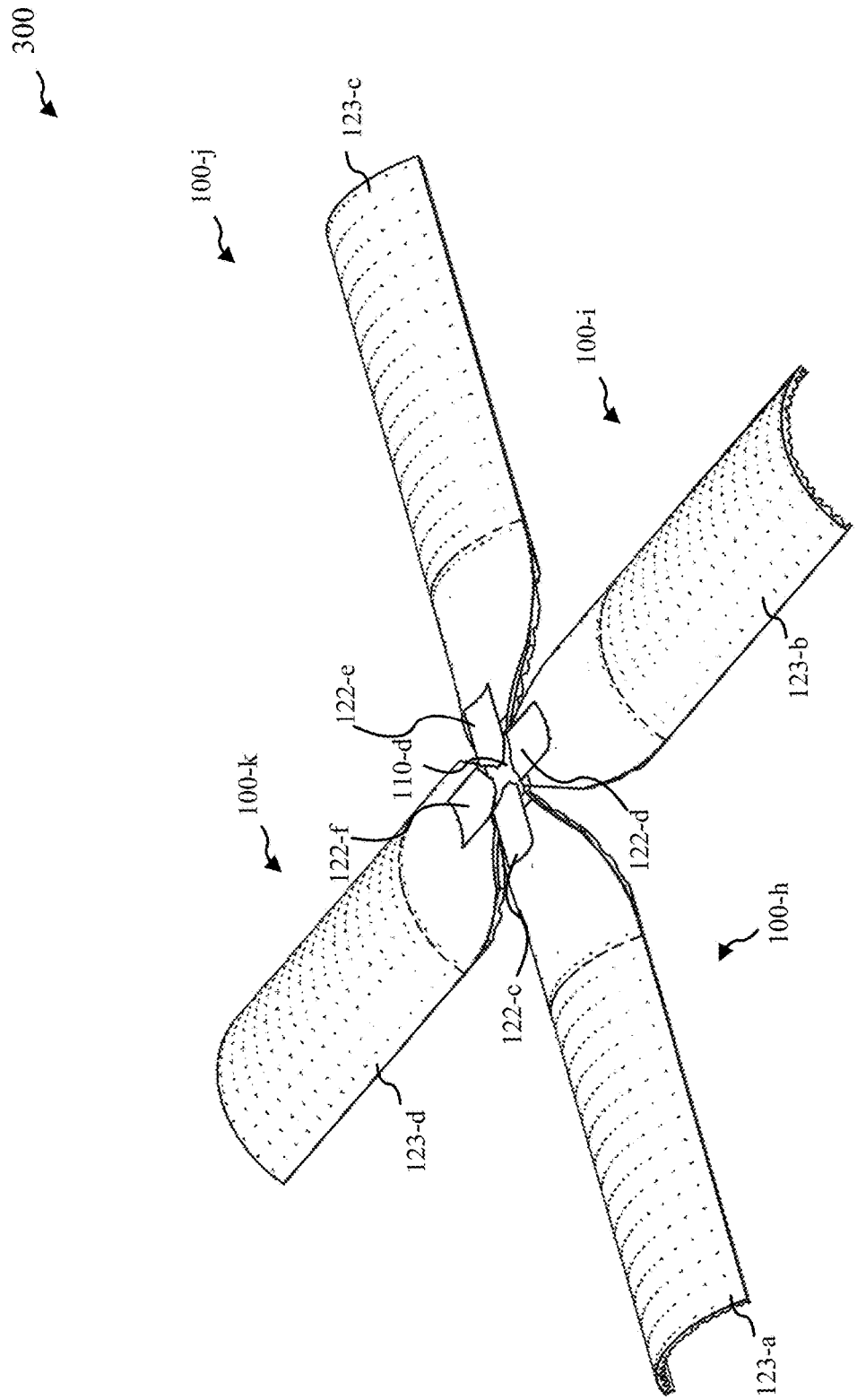
FIG. 3B shows a system and/or device in accordance with various embodiments.
Figure 3D:
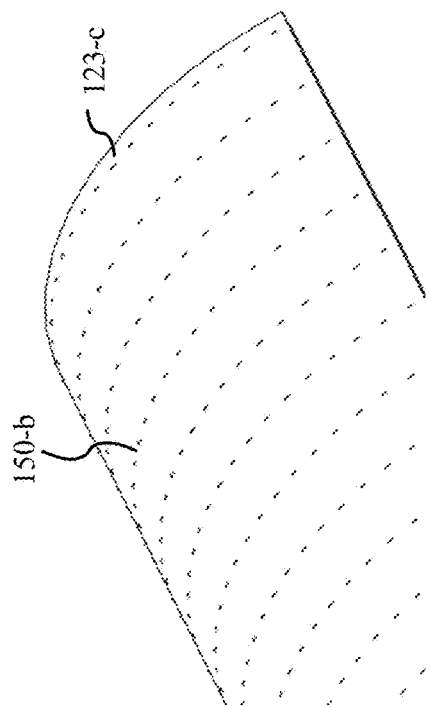
FIG. 3D shows aspects of a device in accordance with various embodiments.
Figure 3C:
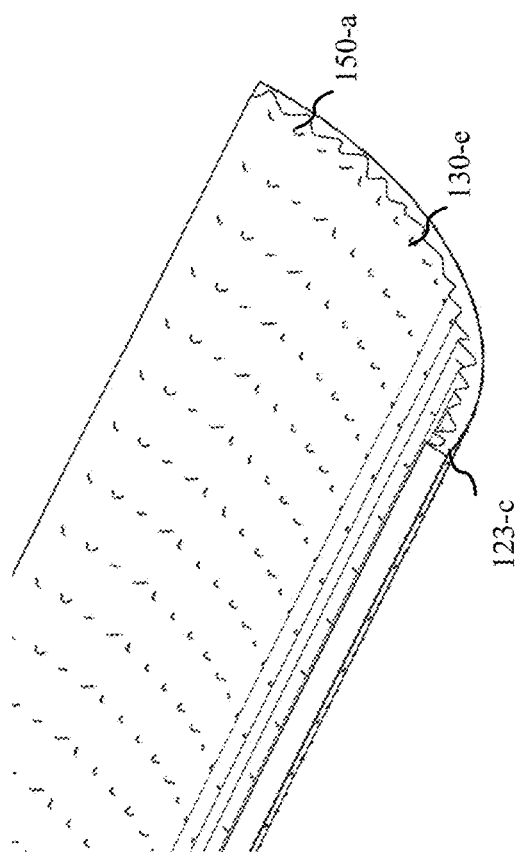
FIG. 3C shows aspects of a device in accordance with various embodiments.

Turning now to FIG. 3A, FIG. 3B, FIG. 3C, and FIG. 3D, aspects of system 300 in accordance with various embodiments are provided. System 300 may include thermal management devices 100-h, 100-i, 100-j, and 100-k, which may be examples of device 100 of FIG. 1A, device 100-b of FIG. 1C, device 100-e of FIG. 1F, and/or device 100-f of FIG. 2A. System 300 may be an example of system 102 of FIG. 1F and/or system 200 of FIG. 2A. FIG. 3A and FIG. 3B provide top isometric view and bottom isometric views of system 300, while FIG. 3C and FIG. D provide top isometric view and bottom isometric view of aspects device 100-i of system 300. System 300 may include tape springs 123-a, 123-b, 123-c, and/or 123-d, which may be parts of devices 100-g, 100-h, 100-i, and/or 100-j respectively. Tape springs 123-a, 123-b, 123-c, and/or 123-d may include beryllium copper tape springs that may be used as a structural element, which may help deploy and/or support loosely stacked sheets 130-c, 130-d, 130-e, and/or 130-f of material, such as PGS (e.g., some embodiments include roughly 75 loosely stacked PGS sheets, though other numbers of sheets may be utilized). The tape spring 123-a, 123-b, 123-c, and/or 123-d may act like a carpenter's tape. The PGS sheets 130-c, 130-d, 130-e, and/or 130-f may not be bonded together outside of the rigid hub region 110-d; the PGS layers 130-c, 130-d, 130-e, and/or 130-f may be allowed to separate sufficiently to enable air-flow between individual sheets. This may result in a drastic increase in surface area available for convective heat loss. Additionally, the PGS sheets and beryllium-copper structures may be loosely stitched together, such as using either a CNT yarn or copper wire. Stitching 150 (see FIG. 3C (150-a) and/or FIG. 3D (150-b) for example) may prevent the loosely stacked PGS layers from excessive billowing and may also have the benefit of increasing through-thickness (z-axis) thermal conductivity. This stitching may be an example of Z-stitching with respect to the radiator sections; in some embodiments, this Z-stitching may also be utilized with respect to rigid hub and/or rigid radiator sections. System 300 may also include flexible deployable structural elements 122-c, 122-d, 122-e, and/or 122-f that may be coupled with the hub 110-d and the structural elements 123-a, 123-b 123-c, and 123-d, respectively. In some embodiments, the flexible deployable structural elements 122-c, 122-d, 122-e, and/or 122-f may include tape springs, such as beryllium copper tape springs. While system 300 generally shows four thermal management devices 100, other embodiments may include more or fewer thermal management devices. In some embodiments, tape springs and/or flexible deployable structural elements may include high-strain composites.

Merely by way of example, from simple one-dimension models, the composite panel composition and through-thickness bonding at the base may be determined. For a relatively high effective thermal conductivity and reasonable layer count, some embodiments may include a layup composed of 32 layers of 40 μm thick graphite and 6 μm thick adhesive, which may result in an effective in-plane thermal conductivity of 1150 W/m-K. Utilizing CNT stitching at the base of the panel, the z-axis effective thermal conductivity may be reduced by 6 times in some embodiments, which may facilitate heat transfer into all layers of graphite. Using this effective thermal conductivity, thermal models may be developed to predict base temperatures for four different panel configurations. Due to the large exposed surface area, a four-panel configuration may result in the lowest base temperature of 120° C., for example, in some embodiments.

Figure 4A:
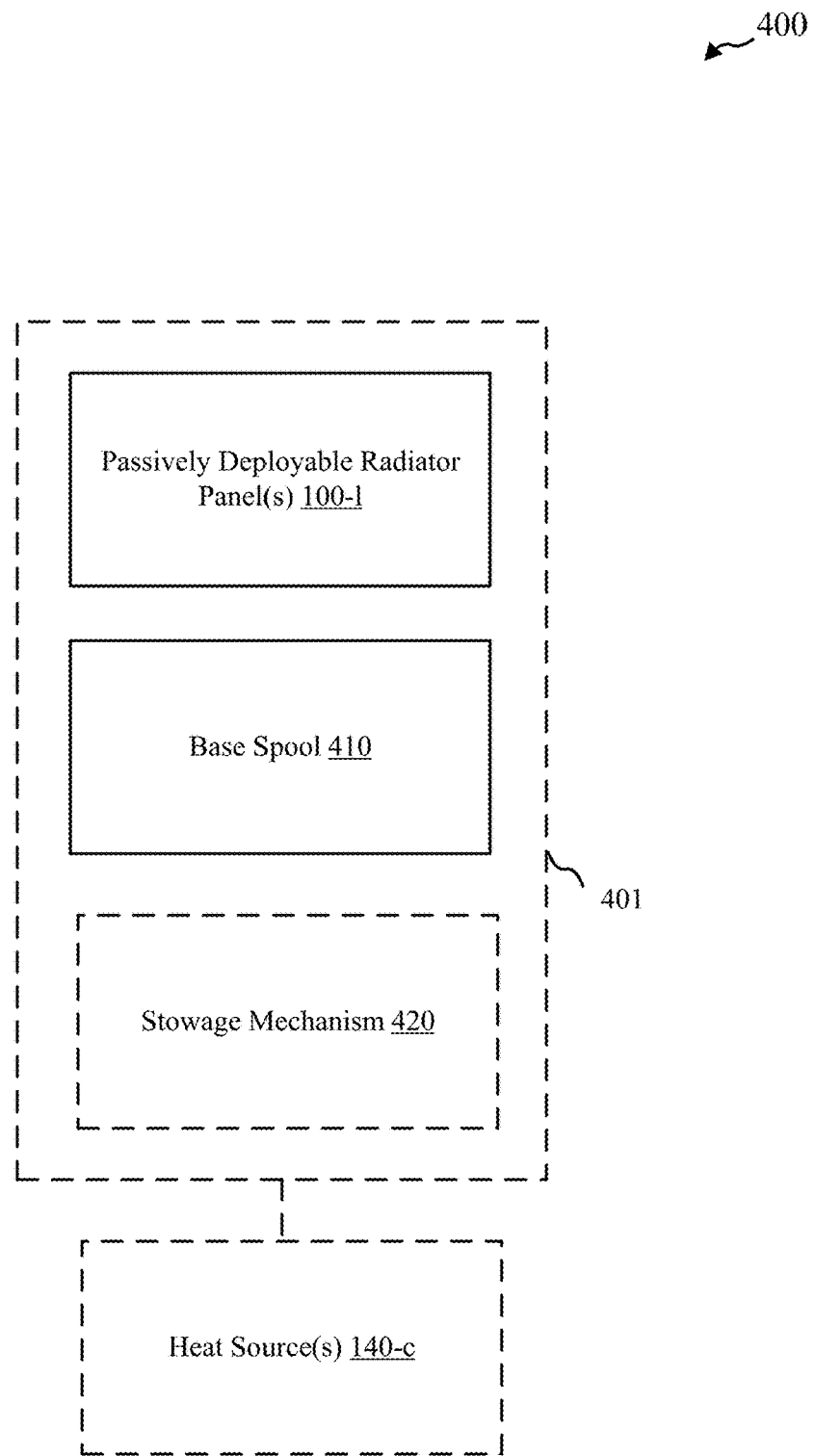
FIG. 4A shows a system in accordance with various embodiments.

Turning now to FIG. 4A, a system 400 in accordance with various embodiments is provided. System 400 may include a deployable radiator system 401, which may include one or more passively deployable radiator panels 100-l, a base spool 410, and/or a stowage mechanism 420. System 400 may also include one or more heat sources 140-c that may be coupled to the deployable radiator system 401. The one or more passively deployable radiator panels 100-l may be examples of device 100 of FIG. 1A, device 100-c of FIG. 1D, and/or device 100-d of FIG. 1E. System 400 may be an example of system 101 of FIG. 1E.

Base spool 410 may be coupled with the one or more radiator panels 100-sl. The base spool 410 may be thermally conductive. The thermally conductive spool 410 may be configured to couple thermally the one or more radiator panels 100-l with the one or more heat sources 140-c. The thermally conductive spool 410 may be configured to couple thermally the one or more radiator panels 100-l with each other.

Some embodiments include one or more heat straps configured to couple the one or more radiator panels 100-l with one or more heat sources 140-c. In some embodiments, the one or more radiator panels 100-l are coupled with the base spool 410 such that the one or more radiator panels 100-l deploy passively through unfurling from around a central axis of the base spool 410 from a stowed configuration to a deployed configuration. In some embodiments, the one or more radiator panels 100-l include two or more radiator panels.

Figure 4B:
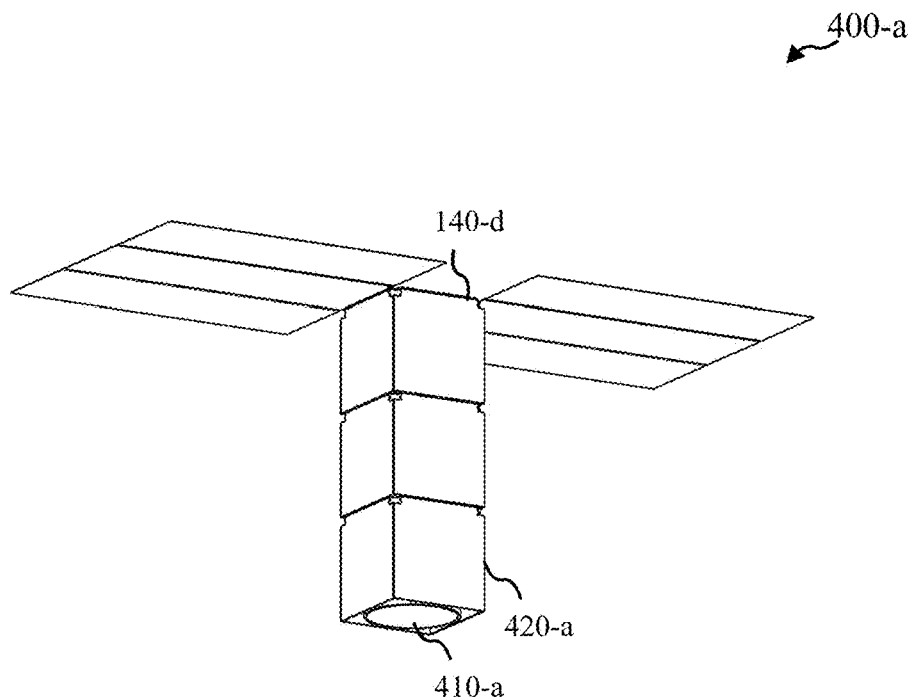
FIG. 4B shows a system in accordance with various embodiments.
Figure 4C:
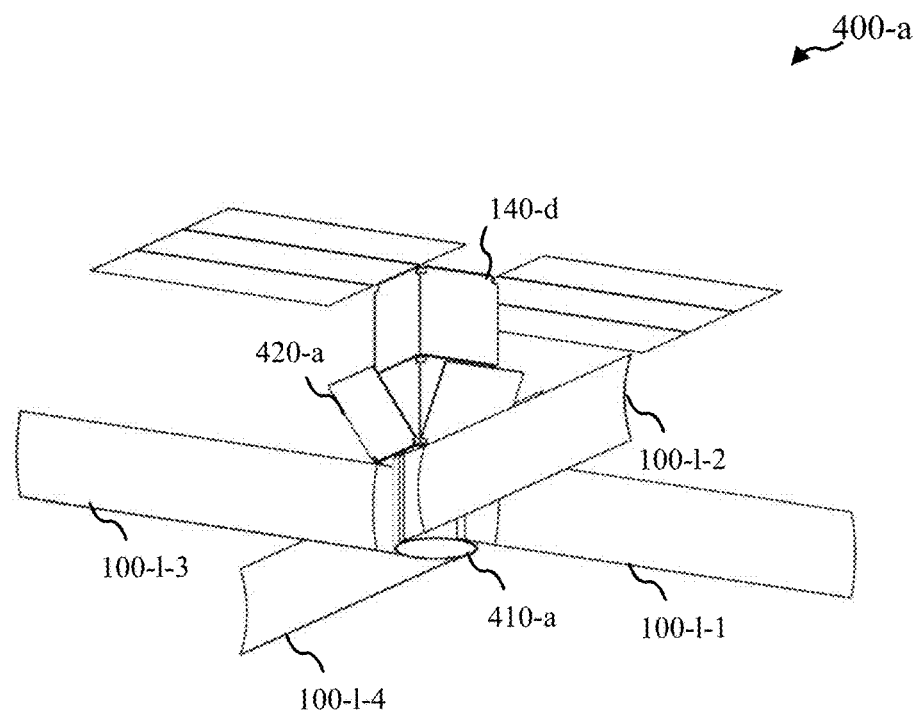
FIG. 4C shows a system in accordance with various embodiments.

FIG. 4B and FIG. 4C show a system 400-a in a stowed state (FIG. 4B) and in a deployed state (FIG. 4C) in accordance with various embodiments. System 400-a may be an example of system 400 of FIG. 4A. System 400-a may provide compact, lightweight, efficient, and/or low-cost deployable radiators, which may be applicable to different satellite systems such as CubeSat and SmallSat, for example. System 400-a may include one or more passively deployable radiators or panels 100-l-1, 110-l-2, 100-l-3, and/or 100-l-4, which may be examples of radiators 100 of FIG. 1A, 100-c of FIG. 1D, 100-d of FIG. 1E, and/or 100-l of FIG. 4A. In some embodiments, the radiators 100-l-1, 110-l-2, 100-l-3, and/or 100-l-4 include radiator panels constructed from highly conductive high-strain composite laminates.

In some embodiments, system 400-a may be capable of dissipating over 50-watts of thermal energy, though other values may be achieved by systems in accordance with various embodiments. System 400-a may show heat source 140-d, which may include heat generating components of a satellite, that may be thermally coupled with the four deployable radiator panels 100-l-1, 110-l-2, 100-l-3, and/or 100-l-4. System 400-a may also include a base spool 410-a, which may facilitate thermally coupling the heat source 140-d with the panels 100-l-1, 110-l-2, 100-l-3, and/or 100-l-4. System 400-a may also include a storage housing 420-a that may hold the radiator panels 100-l-1, 110-l-2, 100-l-3, and/or 100-l-4 in a stowed configuration, then open up to release and deploy the panels 100-l-1, 110-l-2, 100-l-3, and/or 100-l-4, providing a stowage and release mechanism. Storage housing 420-a may also provide a protective enclosure for the panels 100-l-1, 110-l-2, 100-l-3, and/or 100-l-4.

While solar arrays and instrument capabilities in CubeSat applications may keep growing, the limited radiator surface may result in a thermal bottleneck that may limit the actual use of science or communication instruments. Typically, state-of-the-art deployable radiators may use multiple rigid panels connected by a flexible hinge, replicating designs used in large space structures (e.g., radiators on ISS). However, the miniaturization of such designs may have generally proven incapable of meeting the tight mass and volume constraints of CubeSat applications. Systems 400-a may utilize a novel packaging of large surface areas, made of highly conductive materials, and with enough strain energy to deploy passively in a radial arrangement when in space. System 400-a may avoid the need of using a live hinge, resulting in a robust and efficient thermal and structural design.

In some embodiments, panels 100-l-1, 110-l-2, 100-l-3, and/or 100-l-4 may be made of highly conductive composite laminates, with enough strain energy to deploy passively while in space. In some embodiments, the base spool 410-a may include a highly conductive base spool.

System 400-a may rely on the strain energy within the panels 100-l-1, 110-l-2, 100-l-3, and/or 100-l-4 to deploy, thus bypassing the need for mechanical hinges that may require thermal or thermo-mechanical actuators. System 400-a may utilize a panel geometry that may be in the shape of a tape spring and may utilize a highly conductive high-strain laminated construction that may be capable of surviving the packaging strains while also providing the deployment energy, thermal properties, and surface area. This may result in an elegant solution that may require no moving parts or actuators.

Figure 4D:
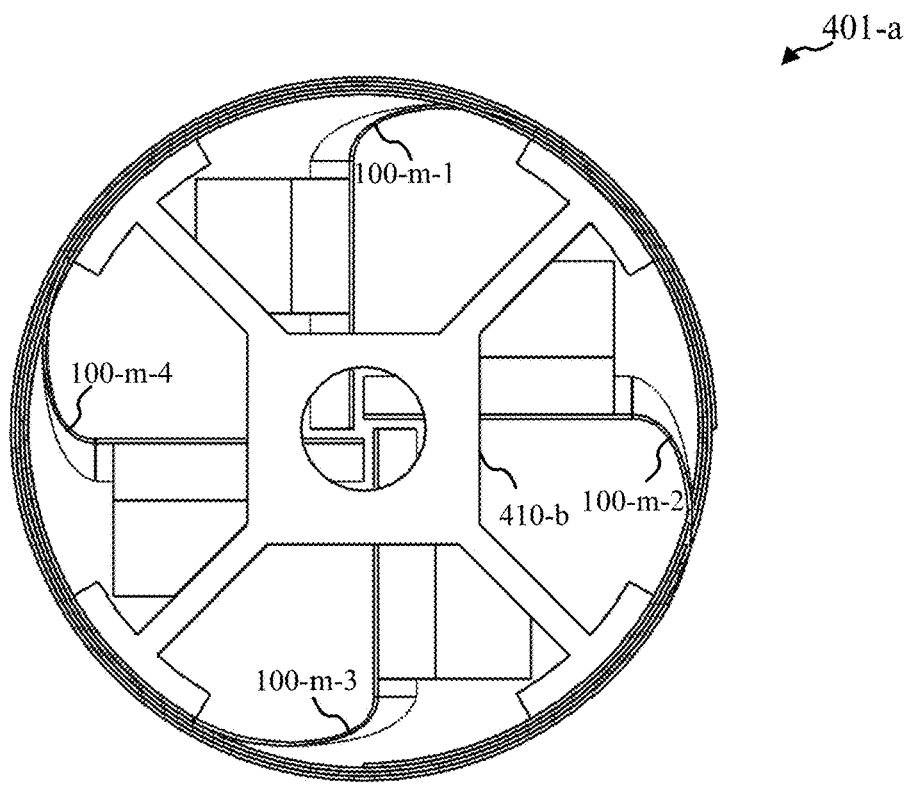
FIG. 4D shows a system and/or device in accordance with various embodiments.
Figure 4E:
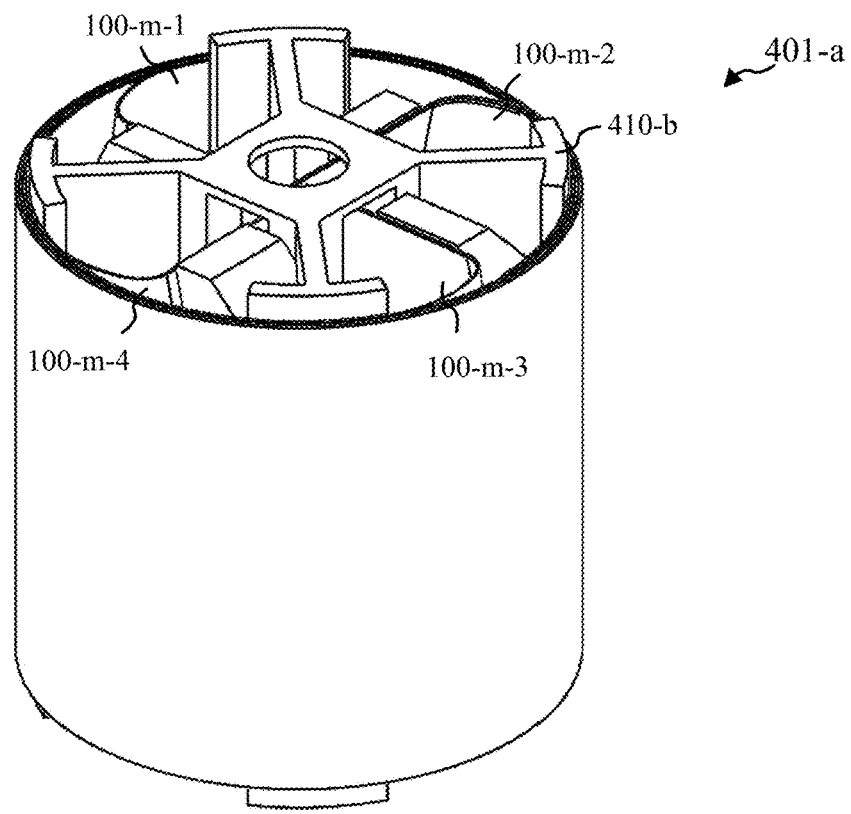
FIG. 4E shows a system and/or device in accordance with various embodiments.

Turning now to FIG. 4D and FIG. 4E, a passively deployable radiator system 401-a in accordance with various embodiments is provided. FIG. 4D shows a top view of system 401-a in a stowed state, while FIG. 4E shows an isometric view of system 401-a in a deployed state. System 401-a may be an example of aspects of system 401 of FIG. 4A. System 401-a may include multiple radiator panels 100-m-1, 100-m-2, 100-m-3, and 100-m-4. Panels 100-m-1, 100-m-2, 100-m-3, and 100-m-4 may be examples of 100 of FIG. 1A, 100-c of FIG. 1D, 100-d of FIG. 1E, 100-l of FIG. 4A, and. Panels 100-m-1, 100-m-2, 100-m-3, and 100-m-4 may be configured to deploy passively. System 401-a may include a hub 410-b that may thermally couple with the panels 100-m-1, 100-m-2, 100-m-3, and 100-m-4; the hub 410-a may couple the panels 100-m-1, 100-m-2, 100-m-3, and 100-m-4 with a heat source.

Figure 5A:
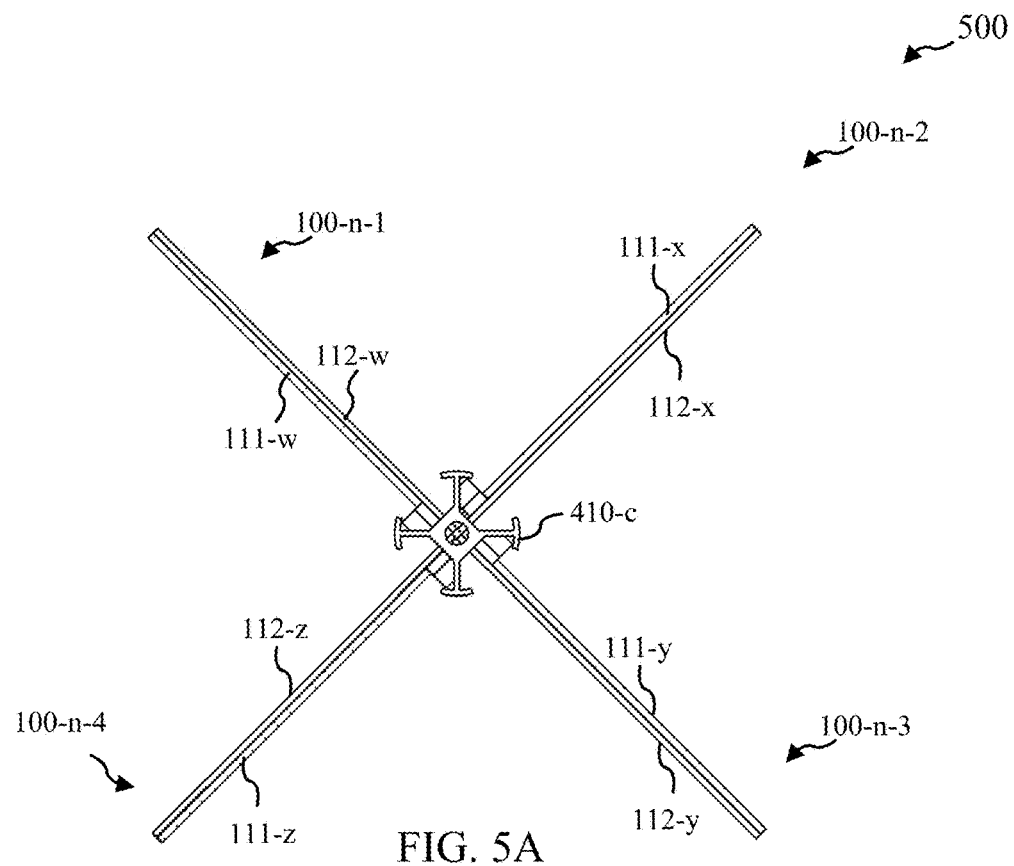
FIG. 5A shows a system and/or device in accordance with various embodiments.
Figure 5B:
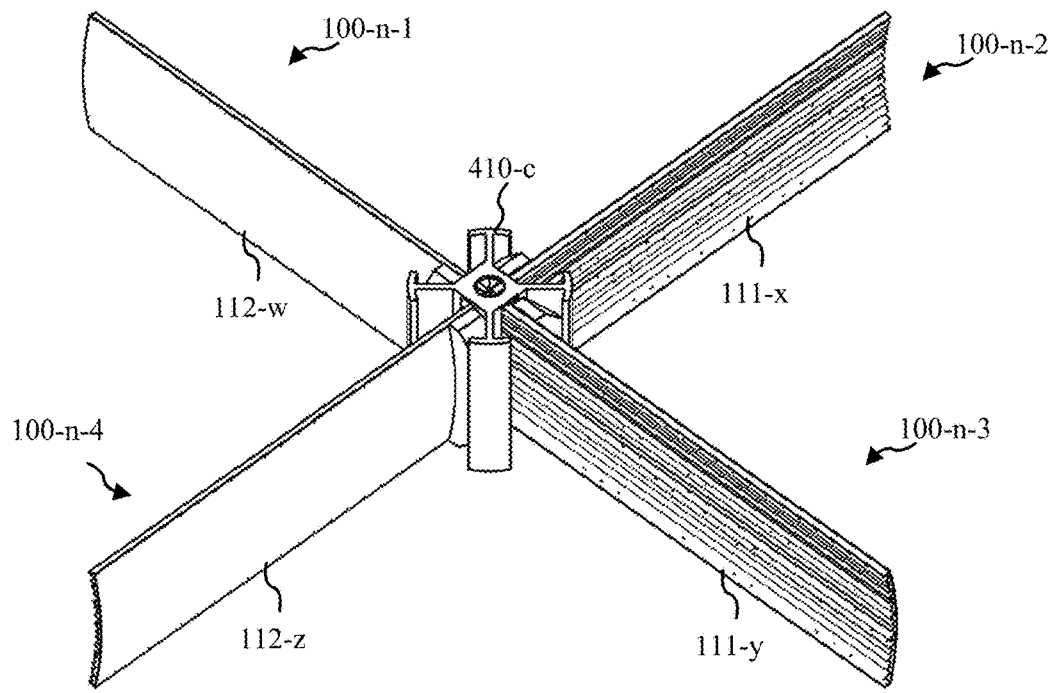
FIG. 5B shows a system and/or device in accordance with various embodiments.

Turning now to FIG. 5A and FIG. 5B, a top view and an isometric view, respectively, of a system 500 in accordance with various embodiments are provided. System 500 may be an example of system 400 of FIG. 4A. System 500 may include base spool 410-c, which may be an example of base spool 410 of FIG. 4A and/or base spool 410-b of FIG. 4D and/or FIG. 4E, in particular. The base spool 410-c may be coupled with multiple passively deployable radiator panels 100-n-1, 100-n-2, 100-n-3, and/or 100-n-4. Panels 100-n-1, 100-n-2, 100-n-3, and/or 100-n-4 may be examples of panels 100 of FIG. 1A, 100-b of FIG. 1B, 100-c of FIG. D, and/or 100-l of FIG. 4A. Each radiator panel 110-n may include a tape spring and multiple loosely stacked sheets. For example, system 500 may include tape springs 112-w, 112-x, 112-y, and/or 112-z. Tape springs 112-w, 112-x, 112-y, and/or 112-z may include beryllium copper tape springs that may be used as a structural element, which may help deploy and/or support loosely stacked sheets of material 111-w, 111-x, 111-y, and/or 111-z, such as pyrolytic graphite (or graphene) sheets (PGS) (e.g., some embodiments include roughly 75 loosely stacked PGS sheets, though other numbers of sheets may be utilized). The tape springs 112-w, 112-x, 112-y, and/or 112-z may act like a carpenter's tape. The PGS sheets 111-w, 111-x, 111-y, and/or 111-z may not be bonded together outside of the base spool. The PGS layers 111-w, 111-x, 111-y, and/or 111-z may be allowed to separate sufficiently to enable air-flow between individual sheets. This may result in a drastic increase in surface area available for convective heat loss. Additionally, the PGS sheets and beryllium-copper structures may be loosely stitched together, such as using either a CNT yarn or copper wire. Stitching may prevent the loosely stacked PGS layers from excessive billowing and may also have the benefit of increasing through-thickness (z-axis) thermal conductivity. This stitching may be an example of Z-stitching with respect to the radiator sections; in some embodiments, this Z-stitching may also be utilized with respect to rigid hub and/or rigid radiator sections. While system 500 generally shows four radiator panels 100-n, other embodiments may include more or fewer thermal management devices. In some embodiments, tape springs and/or flexible deployable structural elements may include high-strain composites.

Figure 8A:
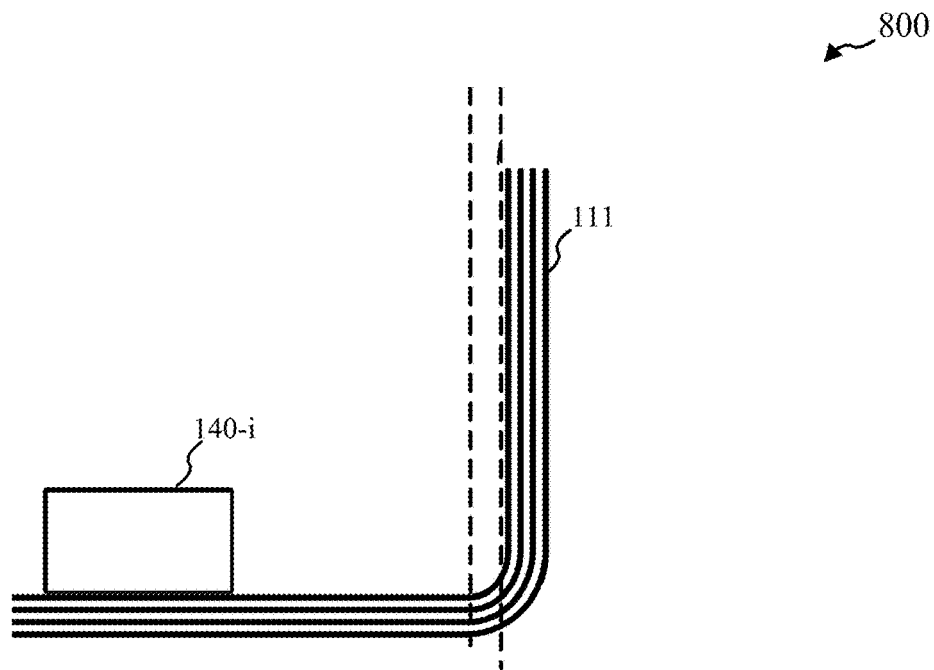
FIG. 8A shows a system in accordance with various embodiments.
Figure 8B:
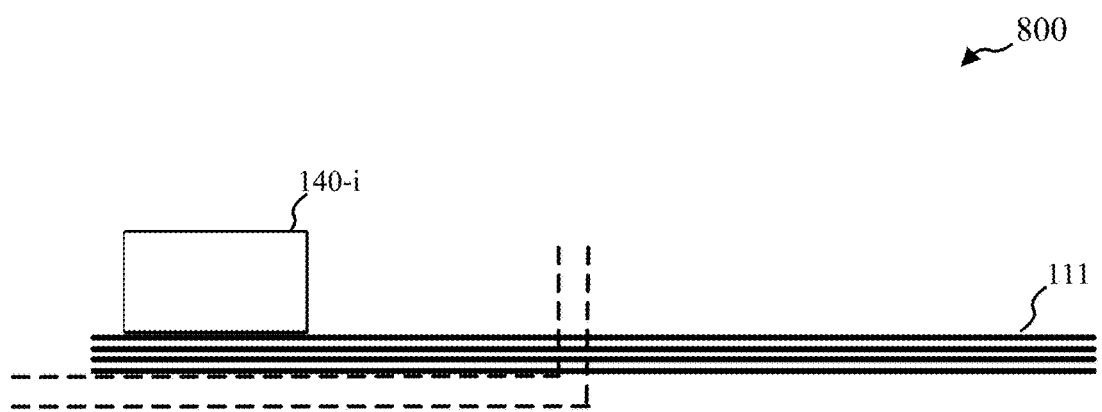
FIG. 8B shows a system in accordance with various embodiments.

Turning now to FIG. 6A, a system 600 in accordance with various embodiments is provided. System 600 may include a flip-out passively deployable radiator device 100-o, which may be coupled with one or more heat sources 140-e. Device 100-o may be an example of device 100 of FIG. 1A. In particular, device 100-o may be an example of device 100-a of FIG. 1B and/or device 100-e of FIG. 1F, where the flip-out passively deployable radiator device 100-o may include multiple thermally conductive layers, such as multiple graphite and/or graphene sheets coupled with one or more strain energy components, such as high-strain composite battens. In some embodiments, the flip-out passively deployable radiator device 100-o may be fabricated to be curved in a deployed configuration, while being a flat in a stowed configuration, which may be strained; this may be facilitated by fabricating the high-strain composite battens with curvature. While system 600 may be fabricated as a flip-out device to be curved in a deployed configuration, some embodiments may be formed as a fold-out device, where the stowed configuration may be folded or curved and then flattened in the deployed configuration; FIG. 8A and FIG. 8B may provide such a configuration.

Figure 6B:
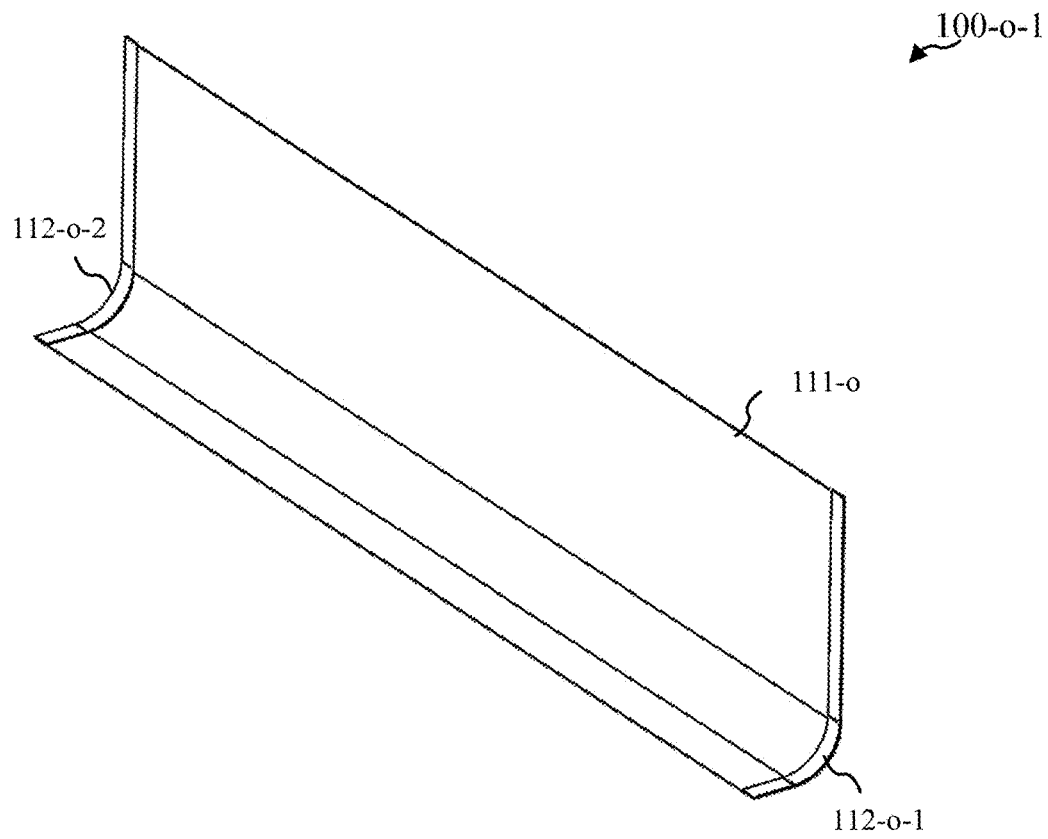
FIG. 6B shows a device in accordance with various embodiments.

FIG. 6B shows a device 100-o-1 in accordance with various embodiments, which may be an example of device 100-o of FIG. 6A. Device 100-o-1 may include multiple thermally conductive layers 111-o that may be coupled with strain energy components 112-o-1, 112-o-2, which may include curved high-strain composite battens. Device 100-o-1 may provide for decoupling of the thermal and mechanical functionality of the device. This may allow the device 100-o-1 to take advantage of high-strain composite structures, such as high strain composite battens 112-o-1, 112-o-2, while removing a possible need to boost the thermal conductivity of those structures. Device 100-o-2 may also allow for a tighter bending radius. In some embodiments, device 100-o-1 may utilize high strain composites for strain energy components 112-o-1, 112-o-2 that may be fabricated curved (i.e.: in the deployed configuration) and are stowed (i.e., strained) to a flat configuration; this may allow for device 100-o-1 to be stowed flat on a side of heat source, such as a satellite (e.g., a side of a CubeSat). The high thermal conductivity that may be involved with dissipating heat away from a heat source may also be better achieved through multiple thermally conductive layers 111-o, such as with thin layers of pyrolytic graphite sheet (PGS, e.g., k>1,000 W/m-K). In some embodiments, the multiple thermally conductive layers 111-o may be encapsulated inside of an envelope with a high emissivity and low absorptivity surface. In some embodiments, the multiple thermally conductive layers 111-o may be adhered or bonded with each other utilizing adhesives, diffusion bonding, or other techniques. In some embodiments, the multiple thermally conductive layers 111-o are left separate from each other.

In some embodiments, the more isolated strained region in the stowed structure of the strain components 112-o-1, 112-o-2 may be tailored with an asymmetric thermally active composite laminate to obtain variable performance heat dissipation. This may be achieved by designing a laminate architecture that may curve at warmer temperatures and straightens at cooler temperatures. The result may provide for device 100-o that may deploy when the spacecraft may be hot and may need greater radiator surface area but may stow when the spacecraft may be cooler and may need to reduce its radiator surface area.

Figure 6C:
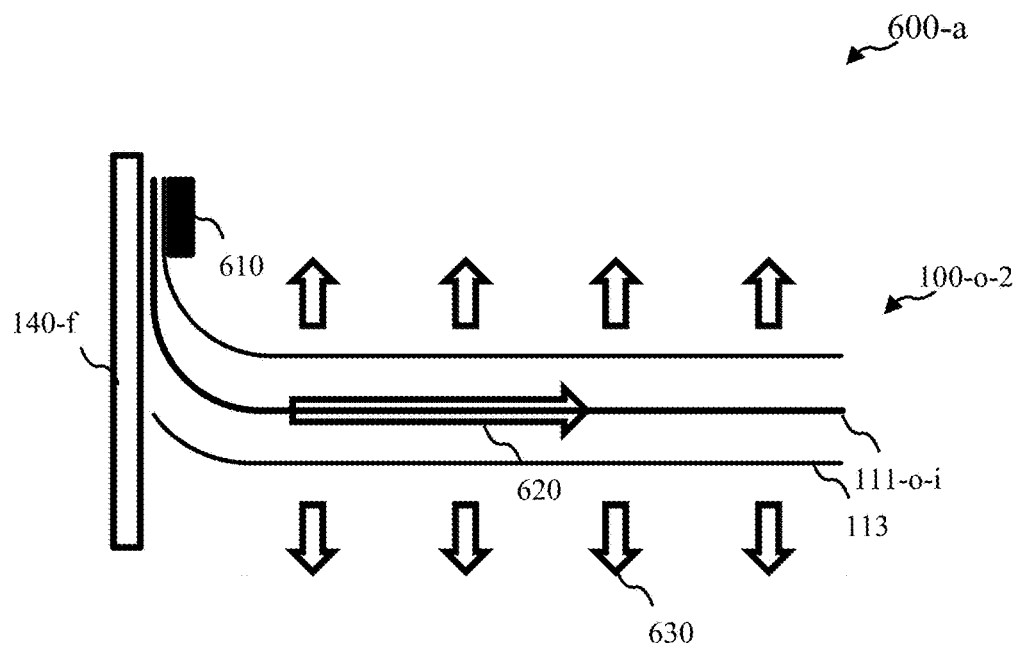
FIG. 6C shows a system in accordance with various embodiments.

FIG. 6C shows a system 600-a in accordance with various embodiments. System 600-a may be an example of system 600 of FIG. 6A and may include a device 100-o-2, which may be an example of device 100-o of FIG. 6A or device 100-o-1 of FIG. 6B. In particular, one or more thermally conductive layers 111-o-i may be called out. Device 100-o-2 may be coupled with a heat source 140-f, such as a spacecraft bus with clamp 610. During operation, the thermally conductive layers 111-o-i, such as PGS sheets, may conduct heat 620 along its plane away from the spacecraft 140-f. Heat 630 may then flow to the outer surface envelope 113, either by low resistance conduction through the thin package or by radiation between the sheets of PGS 111-o-i and the envelope 113 if they are loose and not directly bonded together. Either way, the conductivity of the PGS material 111-o-i may generally far exceed any that can be achieved in a high strain composite. This may allow the composite battens (see 112-o-1, 112-o-2 of FIG. 6B, for example) to be optimized for the ideal bend radius to expose the most amount of radiator surface area independently from the need for high thermal conductivity.

Figures 6D, 6E:
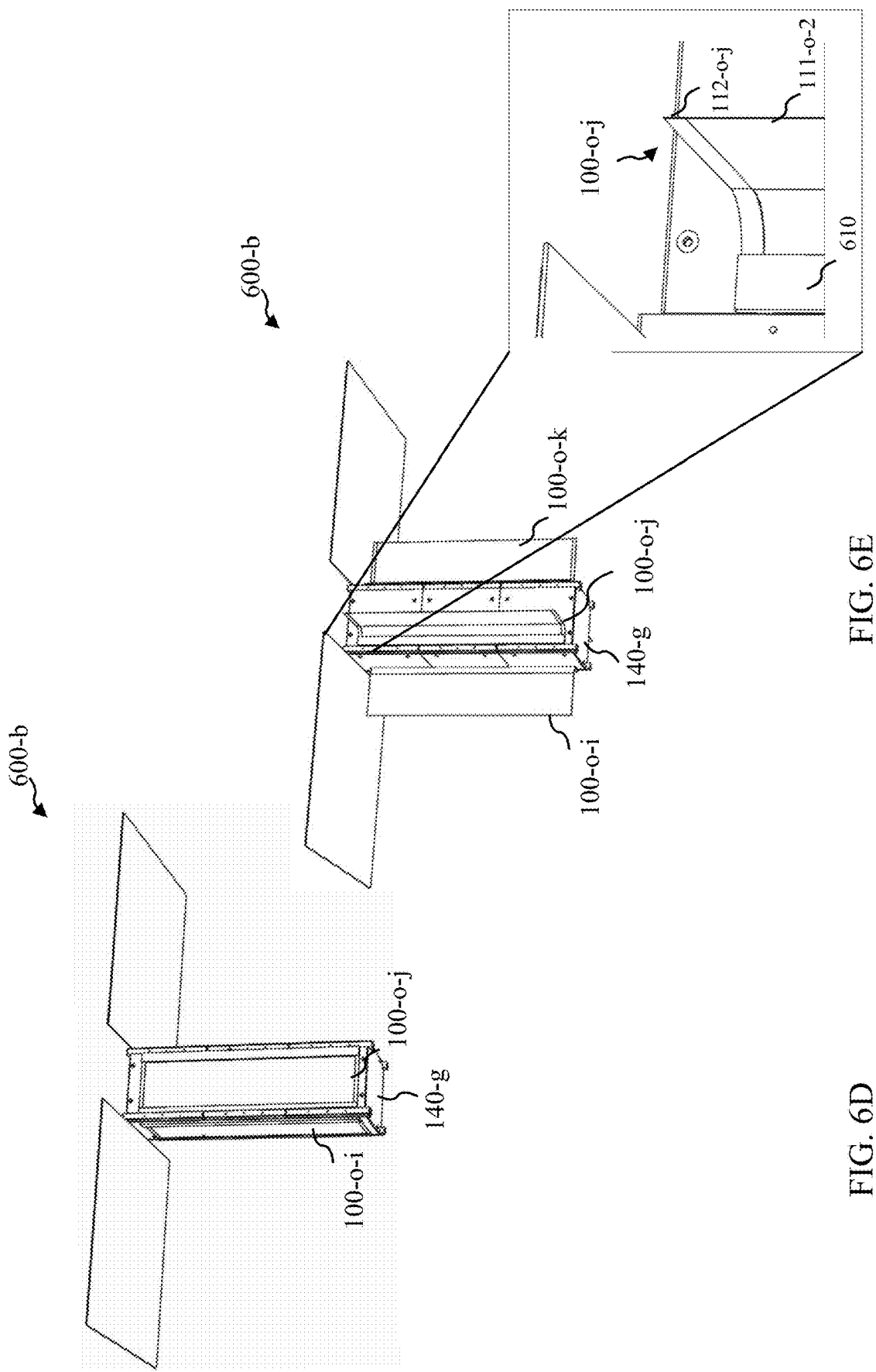
FIG. 6D shows a system in accordance with various embodiments.
FIG. 6E shows a system in accordance with various embodiments.

FIG. 6D and FIG. 6E show a system 600-b in a stowed state and a deployed state, respectively, in accordance with various embodiments. A highlighted section of the deployed state shown in FIG. 6E shows a device 100-o-j; similar devices 100-o- and 100-o-k are also shown in FIG. 6D and/or FIG. 6E (a fourth device 100-o may be obscured from view). Device 100-o-j may include multiple thermally conductive layers 111-o-2, such as PGS layers, and one or more strain energy components 112-o j, such as composite battens. Clamp 610 may help couple device 100-o-j with the heat source 140-g and may provide for thermal conductivity; for example, some embodiments utilize an aluminum clamp 610. Device 100-o-j (and device 100-o-i and 100-o-j) may be examples of device 100 of FIG. 1A, device 100-a of FIG. 1B, device 100-o of FIG. 6A, and/or device 100-o-1 of FIG. 6B.

System 600-b may provide an example where passively deployable radiator devices such as 100-o-i, 100-o-j, and/or 100-o-k may be retrofitted onto the side of an existing system, such as a CubeSat bus as heat source 140-g, when an increase in heat dissipation may be needed without the need to re-configure the bus or to accommodate internal volume for the radiator. By de-coupling the thermal and mechanical functionality into discrete materials in the system, the structural and thermal architecture of system 600-b may address these issues. In some embodiments, conduction of heat away from a bus may also be better achieved with thin layers of pyrolytic graphite sheet 111-o-2 inside of an envelope with a high emissivity and low absorptivity surface.

Figure 6G:
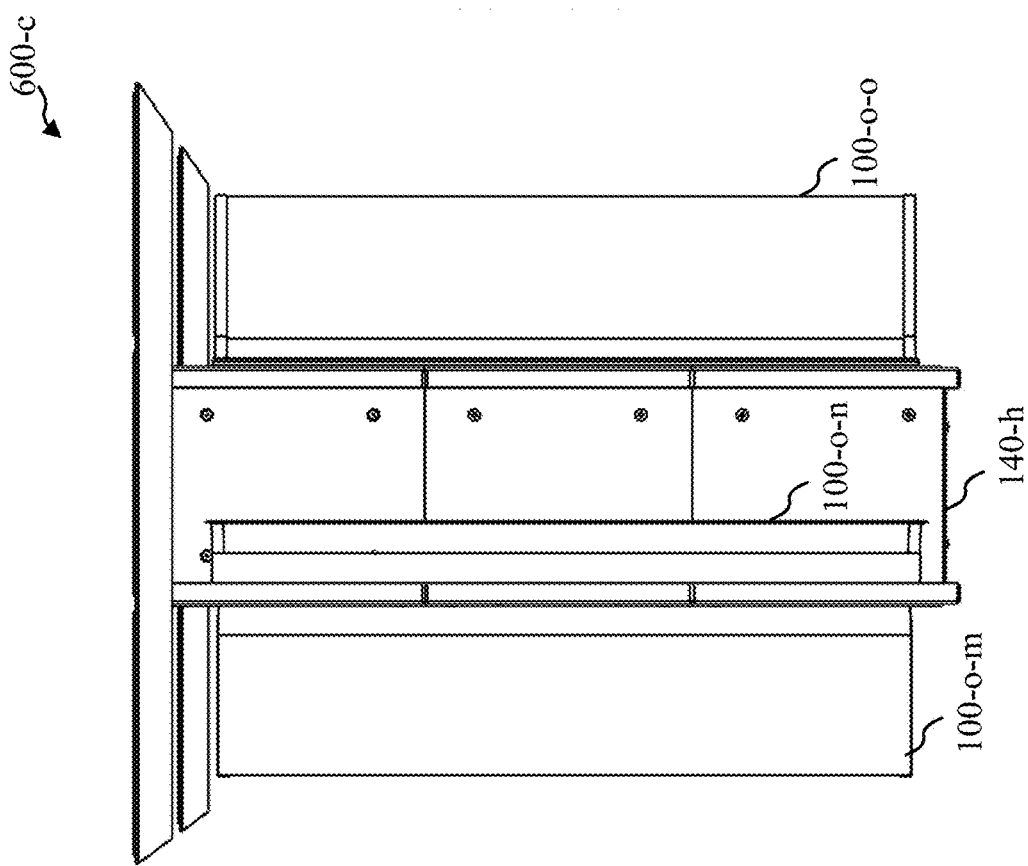
FIG. 6G shows a system in accordance with various embodiments.
Figure 6F:
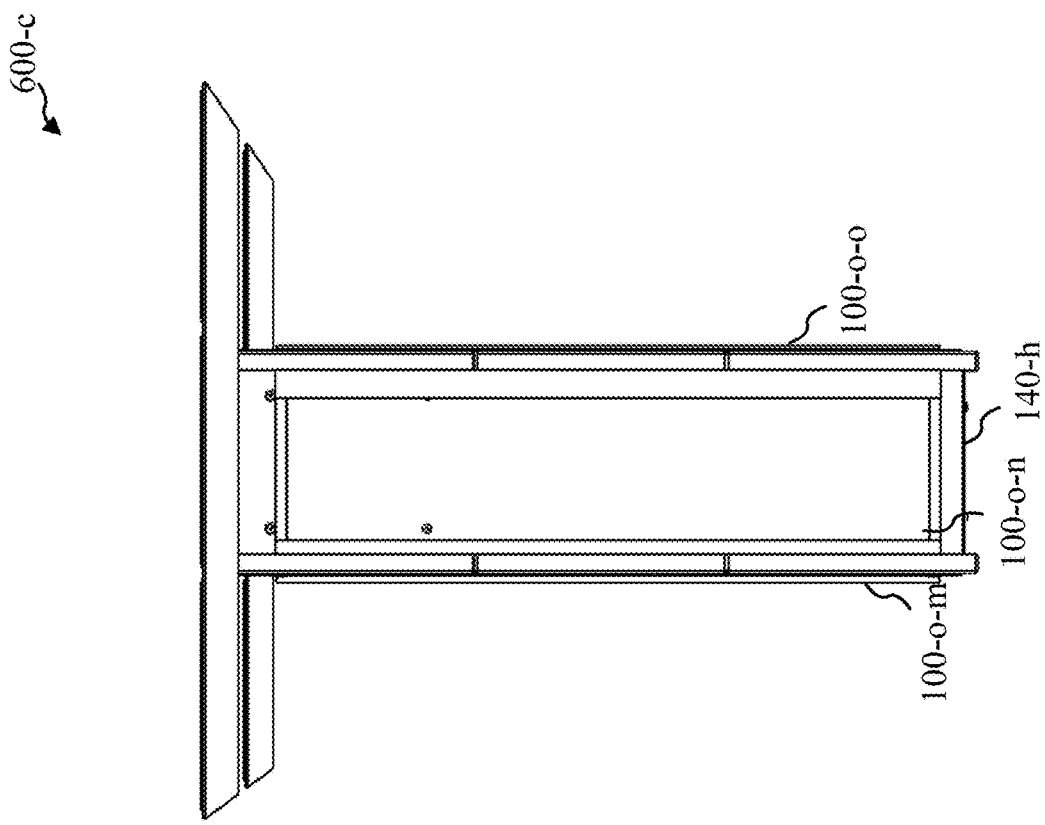
FIG. 6F shows a system in accordance with various embodiments.
Figure 6H:
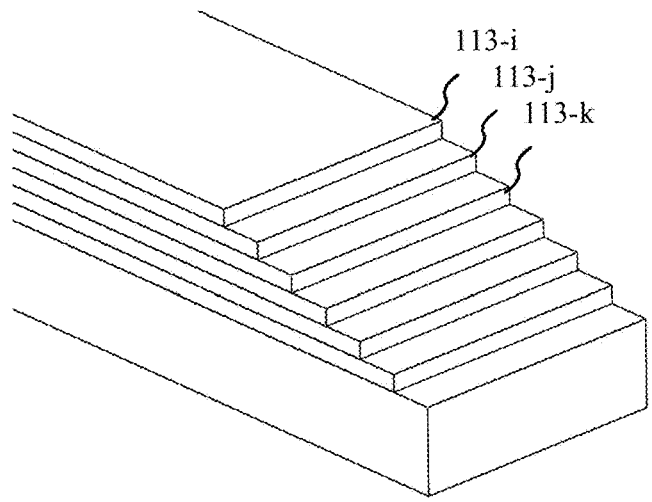
FIG. 6H shows a device in accordance with various embodiments.

FIG. 6F and FIG. 6G show a system 600-c in a stowed state and a deployed state, respectively, in accordance with various embodiments. Devices 100-o-m, 100-o-n, and 100-o-o (a fourth device may be obscured from view) when deployed or flipped out may increase the cross-sectional view factor perpendicular to solar by more than 2× from any angle. This may drastically increase the exposed surface area of a spacecraft 140-h without interfering with the bus design along with more than doubling heat dissipation capability. System 600-c may be may an example of system 102 of FIG. 1E, system 600 of FIG. 6A, system 600-a of FIG. 6C, and/or system 600-b of FIG. FIGS. 6D and/or 6E. Devices 100-o-m, 100-o-n, and 100-o-o may be examples of device 100 of FIG. 1A, device 100-a of FIG. 1B, device 100-e of FIG. 1E, device 100-o of FIG. 6A, device 100-o-1 of FIG. 6B, and/or devices 100-o-i, 100-o-j, and/or 100-o-k of FIGS. 6D and/or 6E.

Turning now to FIG. 611, an example of a high-strain composite component 112-o-k in accordance with various embodiments is provided. The one or more high strain composite component 112-o-k may be configured as a batten as those utilized with respect to FIGS. 6A-6G; component 112-o-k may be example of batten 112-a of FIG. 1B, for example. The high-strain composite component 112-o-k may be configured as an asymmetric composite laminate, which may change shape with a temperature change. The asymmetric composite laminate may have anisotropic layers, such as layers 113-i, 113-j, 113-k. Component 112-o-k may address passive variable heat rejection issues through the use of a thermally activated, fiber composite structures that provide temperature-dependent deflection. Anisotropic carbon fiber composite layup through layers (e.g., 113-i, 113-j, 113-k) such as that may result in a CTE mismatch between inner and outer surfaces of the support structure. Applying heat to the component 112-o-k, configured as a batten for example, may result in deflection of the devices, such as devices 100-o, through changes by roughly 50°, for example; other deflection angles may be achieved.

Figure 7:
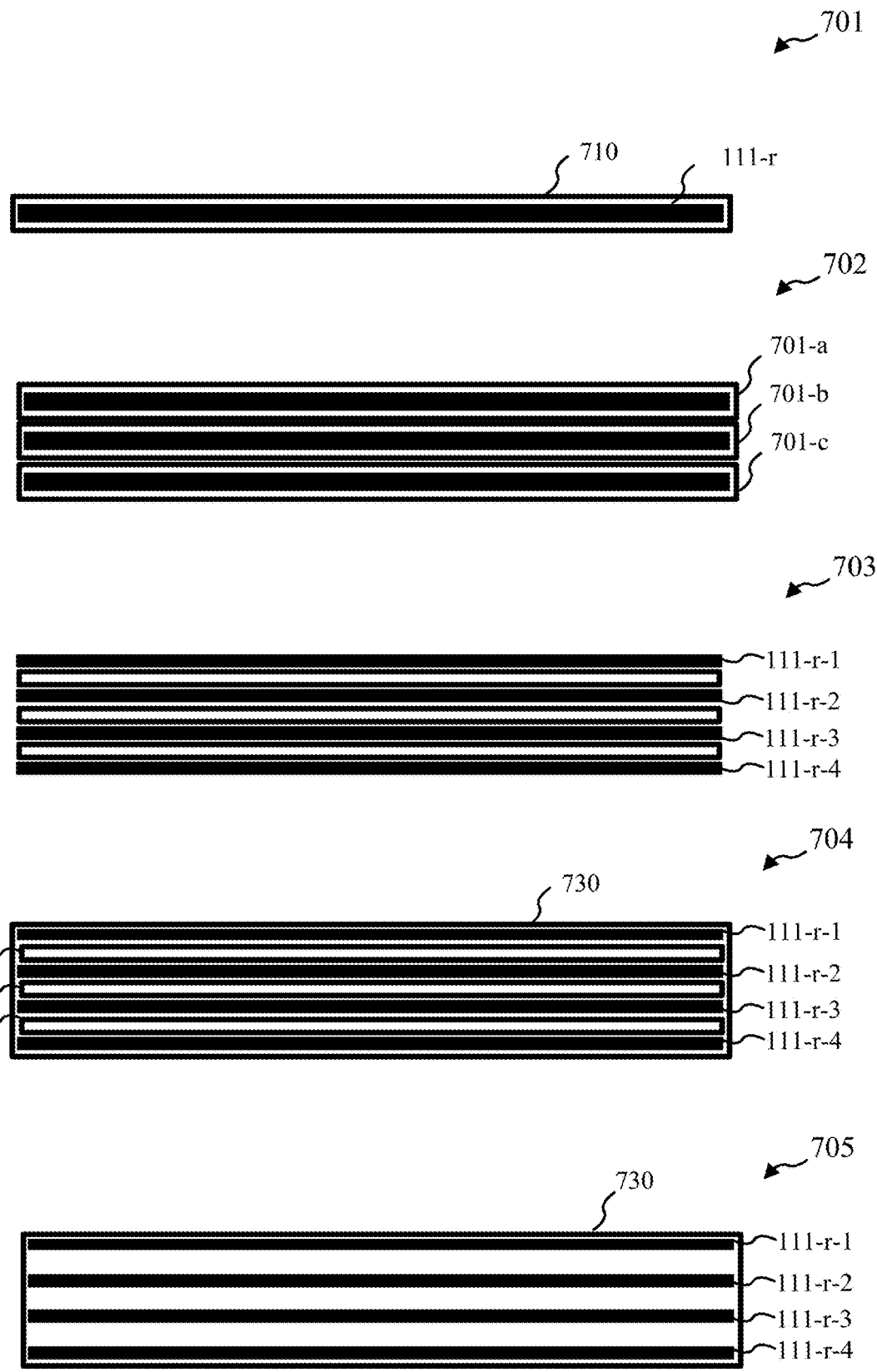
FIG. 7 shows devices in accordance with various embodiments.

Turning now to FIG. 7, a variety of configurations of thermally conductive layers for passively deployable radiator devices are provided in accordance with various embodiments. These configurations may generally show the use of encapsulants, envelopes, adhesives, or other bonding elements, and/or coatings in accordance with various embodiments. These configurations may be generally applicable to the devices 100 with thermally conductive layers 111 of FIG. 1A, FIG. 1B, FIG. 1C, FIG. 1D, and/or FIG. 1E, for example.

Since temperature uniformity may play a dominant role in efficient heat dissipation of the different passively deployable radiators in accordance with various embodiments, the deployable radiator panels may be designed with material that may be both flexible and highly conductive. The use of graphite and/or graphene sheets, such as pyrolytic graphite sheet (PGS), may provide highly conductive layer in the panel construction. A variety of PGS thicknesses may be utilized, including but not limited to 0.001" and 0.004" thick PGS. Though PGS is generally available in thinner and higher conductivity options, these options generally include an acrylic PSA (pressure sensitive adhesive) backing that is available in thicknesses as small as 10 ηm. For 0.001" thick PGS the in-plane thermal conductivity may be 1,600 W/m-K which may be 4× higher than copper.

One of the challenges with PGS may include its fragility and/or susceptibility to environmental degradation. In some embodiments, an encapsulant may be utilized that may help address this challenge. For example, FIG. 7A shows an example 701 of a polymer encapsulant 710 that may encapsulate and support a PGS 111-r. There are several factors that may be considered, including ease of processing, cost, and/or impact on thermal conductivity. In some embodiments, the volume fraction of high thermal conductivity PGS may be maximized, which may mean that the thickness of the encapsulant as well as any adhesive used to bond the sheets together may be minimized.

Merely by way of example some PGS layers may have a 1 mil thickness, though other thicknesses may be utilized. An example thermal conductivity of PGS layer may be 1600 W/mk, though other conductivities may be found. Some PGS layers may be rated from over 3000 bending cycles at a 2 mm radius. Some PGS layers may be delicate with low tear resistance; some embodiments may utilize bonding techniques to address this issue. Some embodiments may utilize off-the-shelf PGS layers, for example, with 4.5 in×7 in dimensions, though other dimensions may be utilized.

Some encapsulation methods include applying an extremely thin and uniform encapsulating layer to each PGS sheet using a dip coating process. To achieve this, the encapsulating polymer, which may include an epoxy or polyurethane (which may be selected based on environmental and structural requirements, for example), may be diluted in a solvent (i.e. acetone) to create a low viscosity varnish. The PGS sheet may then be dipped into the varnish, after which it may be placed in an oven to flash off the solvent and cure the encapsulant. The thickness of the coating may be tailored based on the amount of solvent used in the varnish. Using this method, a uniform coating thickness as thin as 6 microns may be achieved. The resulting encapsulated PGS sheets may have improved handle-ability and environmental robustness.

Example 702 shows an embodiment where individual encapsulated sheets 701-a, 701-b, 701-c may be stacked and a low viscosity adhesive may be used to bond them together, which may result in a panel configuration. In some embodiments, different portions of the stacked sheets may be bonded, such as with respect to a rigid hub and/or rigid radiator. In some embodiments, different portions of the stacked sheets may not be bonded with each other, such as with respect to a flexible layered radiator.

Example 703 provides another an encapsulation (or bonding) method that may include assembling the radiator panel using adhesive and/or bonding components. Example 703 may show multiple PGS layers 111-r-1, 111-r-2, 111-r-3, 111-r-4 and bonding layers 720-a, 720-b, 720-c; while four PGSs layers and three bonding layers may be shown, other embodiments may utilize more or fewer layers.

Some embodiments may utilize an adhesive, such as a Pressure Sensitive Adhesive (PSA) as the bonding layers 720-a, 720-b, 720-c. Acrylic-based PSAs may be made as thin as 6 microns, for example, and some formulations may have excellent environmental resistance. The PSA may function as an encapsulant, while also bonding the individual sheets together to form the panel structure. Some embodiments may utilize other forms of bonding layers 720, such as the use of diffusion bonding with the use of metal foils or meshes as bonding layers 720-a, 720-b, 720-c disposed between the PGS layers 111-r-1, 111-r-2, 111-r-3, 111-r-4. For example, stainless steel foils and/or stainless steel meshes may be utilized; in some embodiments, 304 stainless steel foils and 316 stainless steel mesh 500 (woven screen) may be utilized; other metals and sizes may be utilized.

The interstitial layers of stainless steel 720-a, 720-b, 720-c that bond each of the PGS layers 111-r-1, 111-r-2, 111-r-3, 111-r-4 together may have thermal conductivity 20 times greater than that of some acrylic adhesive. In addition, the bonded joint may be compact and flat, which may create a uniformly thick composite radiator panel. These foils may also be found in thicknesses as low as 0.0005", so very thin layups can be realized. By applying a diffusion bonding process, the contact resistance between PGS layers 111-r-1, 111-r-2, 111-r-3, 111-r-4 and stainless-steel sheets 720-a, 720-b, 720-c may be minimized. Some embodiments may result in a reduced amount of complexity compared to state-of-the-art passive deployable radiator and may allow for direct attachment to components, which may eliminate inherent extra contact resistance introduced in current state-of-the-art devices.

Some embodiments may provide further encapsulation or enveloping for the multiple PGS layers that may be bonded together. For example, to environmentally protect the outside surfaces of the panel, such as panel 703, a thin (e.g., quarter mil thick) layer of Kapton film may be applied to the surfaces of the panel using the PSA or the adhesives in some. Example 704 may show such an example that includes an outer layer 730.

In some embodiments, outer layer 730 may also include one or more coatings; the coatings may act as an envelope or encapsulant in some embodiments. For example, one or more coatings may be applied to one or more surfaces of the one or more the PGS layers 111-r-1, 111-r-2, 111-r-3, 111-r-4. The one or more coatings may include at least a high emissivity coating or a low absorption coating, for example. In some embodiments, the coating(s) may include a silver(Ag)-coated Teflon, though other space-rated materials with high emissivity and/or low absorptivity may be utilized. Some embodiments may apply a coating of black paint to the PGS layers, which may be applicable for when the PGS layers may be utilized for a radiation-based design, in contrast to a conduction-based design. For a radiation-based design, an adhesive or other bonding element may not be placed between the PGS layers in some embodiments (example 705 provides such an example), whereas conduction-based designs (for e.g., examples 701, 702, 703, and/or 704) may generally bond the PGS layers with each other. One may note that increasing the number of PGS layers may generally result in a larger conductive cross-sectional area, which may result in a decrease in the total thermal resistance along the length of a panel.

Some embodiments may be configured to control turn-down ratio with respect to outer layer 730. For example, an aluminized Kapton film as an outer surface coating and/or a black paint coating on the inner surfaces may be utilized in some embodiments.

FIG. 8A and FIG. 8B show a system 800 in a stowed state (FIG. 8A) and a deployed state (FIG. 8B) in accordance with various embodiments. In FIG. 8A, a stowed state may show a multiple PGS layer 111 stack-up and configuration with a heat source 140-i. FIG. 8B may then show a deployed state. A variety of thermal transport mechanisms may be involved in various embodiments. For example, mechanical pressure at the heat source may reduce interfacial thermal resistance. In some embodiments, along the stack-up of PGS layers for example, in-plane conduction may occur along each layer. Radiation may also occur between PGS layers. Radiation to space may also occur. System 800 may provide an example of aspects of systems 102 of FIG. 1E, for example. A variety of strain energy components may be utilized such as those discussed with respect to FIG. 1A, FIG. 1B, FIG. 1C, and elsewhere herein.

Turning now to FIG. 9, a flow diagram of a method 900 is shown in accordance with various embodiments. Method 900 may be implemented utilizing a variety of systems and/or devices such as those shown and/or described with respect to FIG. 1A, FIG. 1B, FIG. FIG. 1C, FIG. 1D, FIG. 1E, FIG. 2A, FIG. 2B, FIG. 2C, FIG. 2D, FIG. 2E, FIG. 2F, FIG. 2G, FIG. 2H, FIG. 2I, FIG. 3A, FIG. 3B, FIG. 3C, FIG. 3D, FIG. 4A, FIG. 4B, FIG. 4C, FIG. 4D, FIG. 4E, FIG. 5A, FIG. 5B, FIG. 6A, FIG. 6B, FIG. 6C, FIG. 6D, FIG. 6E, FIG. 6F, FIG. 6G, FIG. 6G, FIG. 7, FIG. 8A, and/or FIG. 8B. At block 910, strain energy of a radiator panel device may be utilized to deploy passively the radiator panel device. Some embodiments utilize a spool architecture with the passively deployable radiator panel device coupled with a heat source. The radiator panel device may be furled around a hub that may couple the radiator panel device with the heat source. The strain energy of the radiator panel device may be utilized to unfurl and passively deploy the radiator panel device. Some embodiments include a fold-out or flip-out architecture with the passively deployable radiator panel device coupled with a heat source. The strain energy of the radiator panel device may be utilized to fold out or flip out the device for deployment.

These embodiments may not capture the full extent of combination and permutations of materials and process equipment. However, they may demonstrate the range of applicability of the method, devices, and/or systems. The different embodiments may utilize more or fewer stages than those described.

It should be noted that the methods, systems. and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various stages may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are exemplary in nature and should not be interpreted to limit the scope of the embodiments.

Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which may be depicted as a flow diagram or block diagram or as stages. Although each may describe the operations as a sequential process, many of the operations can be performed in parallel or concurrently. In addition, the order of the operations may be rearranged. A process may have additional stages not included in the figure.

Having described several embodiments, it will be recognized by those of skill in the art that various modifications, alternative constructions, and equivalents may be used without departing from the spirit of the different embodiments. For example, the above elements may merely be a component of a larger system, wherein other rules may take precedence over or otherwise modify the application of the different embodiments. Also, a number of stages may be undertaken before, during, or after the above elements are considered. Accordingly, the above description should not be taken as limiting the scope of the different embodiments.

What is claimed is:

1. A passively deployable radiator device comprising:
   a plurality of thermally conductive layers, wherein the plurality of thermally conductive layers include a plurality of stacked carbon layers configured such that:
      a first portion of each of the stacked carbon layers from the plurality of stacked carbon layers are bonded with one another to form a radiator;
      a second portion of each the stacked carbon layers from the plurality of stacked carbon layers remain unbonded from one another to form a hinge region; and
      a third portion of each of the stacked carbon layers from the plurality of stacked carbon layers are bonded with one another to form a hub region positioned such that the hinge region separates the hub region from the radiator; and
   one or more strain energy components configured to deploy passively the plurality of thermally conductive layers.

2. The device of claim 1, wherein the plurality of stacked carbon layers include at least one or more graphite layers or one or more graphene layers.

3. The device of claim 2, wherein at least the one or more graphite layers or the one or more graphene layers include at least one or more pyrolytic graphite sheets or one or more pyrolytic graphene sheets.

4. The device of claim 1, wherein the one or more strain energy components include one or more composite components coupled with the one or more thermally conductive layers.

5. The device of claim 4, wherein the one or more composite components are configured with one or more curved hinge regions when deployed.

6. The device of claim 4, wherein the one or more composite components include one or more composite battens coupled with a side portion of the one or more thermally conductive layers.

7. The device of claim 4, wherein the one or more composite components include an asymmetric composite laminate configured to change shape when a change in temperature.

8. The device of claim 1, wherein the one or more strain energy components include one or more thermally conductive composite laminates with sufficient strain energy to deploy passively the plurality of thermally conductive layers.

9. The device of claim 8, wherein the one or more thermally conductive composite laminates includes one or more laminate layers.

10. The device of claim 1, wherein the one or more strain energy components include one or more tape springs configured to deploy passively the one or more thermally conductive layers.

11. The device of claim 10, wherein the one or more tape springs include a beryllium-copper structure.

12. The device of claim 10, wherein the one or more tape springs include a composite material.

13. The device of claim 1, wherein the first portion of each of the stacked carbon layers from the plurality of stacked carbon layers are bonded with one another to form the radiator utilizing an adhesive and the third portion of each of the stacked carbon layers from the plurality of stacked carbon layers are bonded with one another to form the hub region utilizing adhesive.

14. The device of claim 1, wherein the first portion of each of the stacked carbon layers from the plurality of stacked carbon layers are bonded with one another to form the radiator utilizing diffusion bonding and the third portion of each of the stacked carbon layers from the plurality of stacked carbon layers are bonded with one another to form the hub region utilizing diffusion bonding wherein one or more metal layers are positioned between the plurality of thermally conductive layers.

15. The device of claim 1, wherein plurality of thermally conductive layers are encapsulated.

16. The device of claim 1, wherein the plurality of thermally conductive layers are continuous across the hinge region defined with respect to the one or more strain energy components.

17. The device of claim 1, further comprising one or more coatings applied to one or more surfaces of the plurality of thermally conductive layers or the one or more strain energy components.

18. The device of claim 1, further comprising a base spool coupled with at least the plurality of thermally conductive layers or the one or more strain energy components.

19. The device of claim 18, wherein the base spool is configured to couple thermally at least the plurality of thermally conductive layers with one or more heat sources.

20. The device of claim 19, wherein the plurality of thermally conductive layers are coupled with the base spool such that the plurality of thermally conductive layers deploy passively through unfurling from around a central axis of the base spool from a stowed configuration to a deployed configuration.

21. The device of claim 1, wherein the plurality of stacked carbon layers include one or more carbon fiber plies.

22. The device of claim 21, wherein the one or more strain energy components include one or more laminates coupled with the one or more carbon fiber plies.

23. The device of claim 2, wherein at least the one or more graphite layers or the one or more graphene layers include a plurality of layers that are stitched together utilizing a stitching material.

24. The device of claim 23, wherein the stitching material includes at least CNT yarn or copper wire.

* * * * *